United States Patent [19]
Fujita et al.

[11] Patent Number: 5,510,758
[45] Date of Patent: Apr. 23, 1996

[54] MULTILAYER MICROSTRIP WIRING BOARD WITH A SEMICONDUCTOR DEVICE MOUNTED THEREON VIA BUMPS

[75] Inventors: Suguru Fujita, Tokyo; Kazuaki Takahashi, Kawasaki; Morikazu Sagawa, Tama; Hiroyuki Sakai, Katano; Yorito Ota, Kobe; Kaoru Inoue, Kadoma, all of Japan

[73] Assignee: Matsushita Electric Industrial Co., Ltd., Japan

[21] Appl. No.: 223,979

[22] Filed: Apr. 6, 1994

[30] Foreign Application Priority Data

| Apr. 7, 1993 | [JP] | Japan | 5-080504 |
| Aug. 3, 1993 | [JP] | Japan | 5-192166 |
| Dec. 24, 1993 | [JP] | Japan | 5-328236 |

[51] Int. Cl.⁶ ............... H01P 3/08; H01L 21/58
[52] U.S. Cl. ............ 333/247; 361/795; 257/778; 257/728
[58] Field of Search ............... 333/247, 246; 257/778, 728, 664; 361/764, 768, 792, 795; 174/250, 255

[56] References Cited

U.S. PATENT DOCUMENTS

| 4,250,520 | 2/1981 | Denlinger | 257/778 X |
| 4,617,586 | 10/1986 | Cuvilliers et al. | 333/247 X |
| 4,812,792 | 3/1989 | Leibowitz | 361/795 X |
| 5,087,896 | 2/1992 | Wen et al. | 333/247 X |
| 5,341,115 | 8/1994 | Frei et al. | 333/246 |

FOREIGN PATENT DOCUMENTS

| 58-68954 | 4/1983 | Japan | 257/778 |
| 63-266901 | 11/1988 | Japan. | |

OTHER PUBLICATIONS

Bahl and Bhartia, *Microwave Solid State Circuit Design*, 1988, pp. 781–805 & p. 827.

Wang, *Fundamentals of Semiconductor Theory and Device Physics*, 1989, pp. 462–463.

Mitsui et al., "Technology Growth for 1980's," May 1980, pp. 6–8.

Primary Examiner—Benny T. Lee
Assistant Examiner—Justin P. Bettendorf
Attorney, Agent, or Firm—Parkhurst, Wendel & Rossi

[57] ABSTRACT

A semiconductor device includes a microstrip wiring board. The microstrip wiring board includes a substrate having a main surface, a ground conductor extending on the main surface of the substrate, a dielectric film extending on the ground conductor, and a metal wiring line extending on the dielectric film. A semiconductor chip is connected to the microstrip wiring board via a bump.

1 Claim, 13 Drawing Sheets

5,510,758

MULTILAYER MICROSTRIP WIRING BOARD WITH A SEMICONDUCTOR DEVICE MOUNTED THEREON VIA BUMPS

BACKGROUND OF THE INVENTION

1. Field of the Invention

This invention generally relates to a semiconductor device. This invention specifically relates to a high-frequency semiconductor device or a high-frequency integrated circuit used in a millimeter wave band (an extreme high frequency band, EHF band) to a submillimeter wave band. This invention also relates to a transmission line device or a coupled line device for a high-frequency signal.

2. Description of the Prior Art

Some heterojunction compound semiconductor transistors have cutoff frequencies higher than 100 GHz. Generally, operation of an electric circuit is more affected by parasitic capacitances and inductances as the frequency of a signal handled by the circuit increases. In a microwave band to a millimeter wave band, such parasitic reactances tend to cause serious problems in operation of an electric circuit.

Monolithic microwave integrated circuits (MMIC's) are known as devices which can solve the problems caused by parasitic reactances. The MMIC's have a semiconductor substrate on which inductors, capacitors, resistors, transmission lines, and transistors are formed together by a semiconductor processing technology. The MMIC's tend to be expensive. Since components (parts) of an MMIC are formed together, it is generally difficult to check the performance of each of the components.

SUMMARY OF THE INVENTION

It is an object of this invention to provide an improved semiconductor device.

It is another object of this invention to provide an improved transmission line device.

It is still another object of this invention to provide an improved coupled line device.

A first aspect of this invention provides a semiconductor device comprising a microstrip wiring board including a substrate having a main surface, a ground conductor extending on the main surface of the substrate, a dielectric film extending on the ground conductor, and a metal wiring line extending on the dielectric film; a bump; and a semiconductor chip connected to the microstrip wiring board via the bump.

A second aspect of this invention provides a semiconductor device comprising a microstrip wiring board including a substrate having a main surface, a metal wiring line extending on the main surface of the substrate, a dielectric film extending on the metal wiring line, and a ground conductor extending on the dielectric film; a bump; and a semiconductor chip connected to the microstrip wiring board via the bump.

A third aspect of this invention provides a semiconductor device comprising a microstrip wiring board including a substrate having a main surface, a first metal wiring line extending on the main surface of the substrate, a first dielectric film extending on the first metal wiring line, a ground conductor extending on the first dielectric film, a second dielectric film extending on the ground conductor, and a second metal wiring line extending on the second dielectric film; a bump; and a semiconductor chip connected to the microstrip wiring board via the bump.

A fourth aspect of this invention provides a semiconductor device comprising a microstrip wiring board including a substrate having a main surface, a ground conductor extending on the main surface of the substrate, a dielectric film extending on the ground conductor, and a metal wiring line extending on the dielectric film; first and second bumps; a first semiconductor chip connected to the microstrip wiring board via the first bump; and a second semiconductor chip connected to the microstrip wiring board via the second bump.

A fifth aspect of this invention provides a transmission line device comprising a dielectric member; a central conductor extending on the dielectric member; and a ground conductor mounted on the dielectric member in a flip-chip manner, the ground conductor extending above the central conductor and being separated from the central conductor by a predetermined distance.

A sixth aspect of this invention provides a transmission line device comprising a dielectric member having an upper surface and a lower surface; a first ground conductor extending on the lower surface of the dielectric member; a central conductor extending on the upper surface of the dielectric member; and a second ground conductor mounted on the dielectric member in a flip-chip manner, the second ground conductor extending above the central conductor and being separated from the central conductor by a predetermined distance.

A seventh aspect of this invention provides a semiconductor device comprising a dielectric member having a surface; first and second central conductors extending on the surface of the dielectric member; and a semiconductor integrated circuit including at least one active element and being mounted on the surface of the dielectric member in a flip-chip manner, the semiconductor integrated circuit ;being electrically connected to the first and second central conductors.

An eighth aspect of this invention provides a semiconductor device comprising a dielectric member having a lower surface and an upper surface; a ground conductor extending on the lower surface of the dielectric member; a metal film extending on a first part of the upper surface of the dielectric member and being connected to the ground conductor; a dielectric film extending on the metal film and a second part of the upper surface of the dielectric member; first and second central conductors extending on the dielectric film; and a semiconductor circuit including at least one active element and being mounted on the dielectric film in a flip-chip manner, the semiconductor circuit being electrically connected to the first and second central conductors.

A ninth aspect of this invention provides a semiconductor device comprising a ground conductor; a dielectric film extending on the ground conductor; a first central conductor extending on the dielectric film; a dielectric member mounted on the dielectric film in a flip-chip manner; a second central conductor extending on the dielectric member and facing the first central conductor; and a semiconductor circuit including at least one active element and being mounted on the dielectric film in a flip-chip manner, the semiconductor circuit being electrically connected to the first and second central conductors.

A tenth aspect of this invention provides a device comprising a dielectric member having an upper surface and a lower surface; a first ground conductor extending on the lower surface of the dielectric member: a first central conductor extending on the upper surface of the dielectric member; a second ground conductor mounted on the upper surface of the dielectric member in a flip-chip manner and being separated from the first central conductor by a predetermined distance; a dielectric film extending on a surface of the second ground conductor which faces the dielectric member; and a second central conductor extending on the dielectric film and being located above the first central conductor.

An eleventh aspect of this invention provides a device comprising a first dielectric member having an upper surface and a lower surface; a first ground conductor extending on the lower surface of the first dielectric member; a first central conductor extending on the upper surface of the first dielectric member; a second dielectric member mounted on the upper surface of the first dielectric member in a flip-chip manner and being separated from the first central conductor by a predetermined distance; and a second central conductor extending on a surface of the second dielectric member which faces the first dielectric member and being located above the first central conductor.

A twelfth aspect of this invention provides a device comprising a dielectric member having an upper surface and a lower surface; a ground conductor extending on the lower surface of the dielectric member; first and second central conductors extending on the upper surface of the dielectric member and in parallel with each other, the first and second central conductors being separated from each other by a predetermined gap; and an overlay conductor mounted on the upper surface of the dielectric member and being located above the first and second central conductors, the overlay conductor being separated from the first and second central conductors by a predetermined distance.

A thirteenth aspect of this invention provides a device comprising a first dielectric member having an upper surface and a lower surface; a ground conductor extending on the lower surface of the first dielectric member; first and second central conductors extending on the upper surface of the first dielectric member and in parallel with each other, the first and second central conductors being separated from each other by a predetermined gap; a second dielectric member mounted on the upper surface of the first dielectric member in a flip-chip manner and being located above the first and second central conductors, the second dielectric member being separated from the first and second central conductors by a predetermined distance; and an overlay conductor extending on a surface of the dielectric member which faces the first and second central conductors.

A fourteenth aspect of this invention provides a device comprising a dielectric member; an overlay conductor extending on the dielectric member; a ground conductor mounted on the dielectric member in a flip-chip manner and being located above the overlay conductor, the ground conductor being separated from the overlay conductor by a predetermined distance; a dielectric film extending on a surface of the ground conductor which faces the dielectric member: and first and second central conductors extending on the dielectric film and in parallel with each other, the first and second central conductors being separated from each other by a predetermined gap, the first and second central conductors being located above the overlay conductor.

A fifteenth aspect of this invention provides a device comprising a dielectric member; first and second ground conductors extending on the dielectric member, the first and second ground conductors being separated from each other by a slot of a predetermined width and forming a slot line structure; a third ground conductor mounted on the first and second ground conductors in a flip-chip manner and being located above the first and second ground conductors, the third ground conductor being separated from the first and second ground conductors by a predetermined distance; a dielectric film extending on a surface of the third ground conductor which faces the first and second ground conductors; and a central conductor extending on the dielectric film and facing the first and second ground conductors.

A sixteenth aspect of this invention provides a device comprising a first dielectric member having an upper surface and a lower surface; a first ground conductor extending on the lower surface of the first dielectric member; a central conductor extending on the upper surface of the first dielectric member; a second dielectric member mounted on the upper surface of the first dielectric member in a flip-chip manner and being located above the central conductor, the second dielectric member being separated from the central conductor by a predetermined distance; and second and third ground conductors extending on a surface of the second dielectric member which faces the central conductor, the second and third ground conductors being separated from each other by a slot of a predetermined width and forming a slot line structure.

DESCRIPTION OF THE FIRST PREFERRED EMBODIMENT

Figure 1:
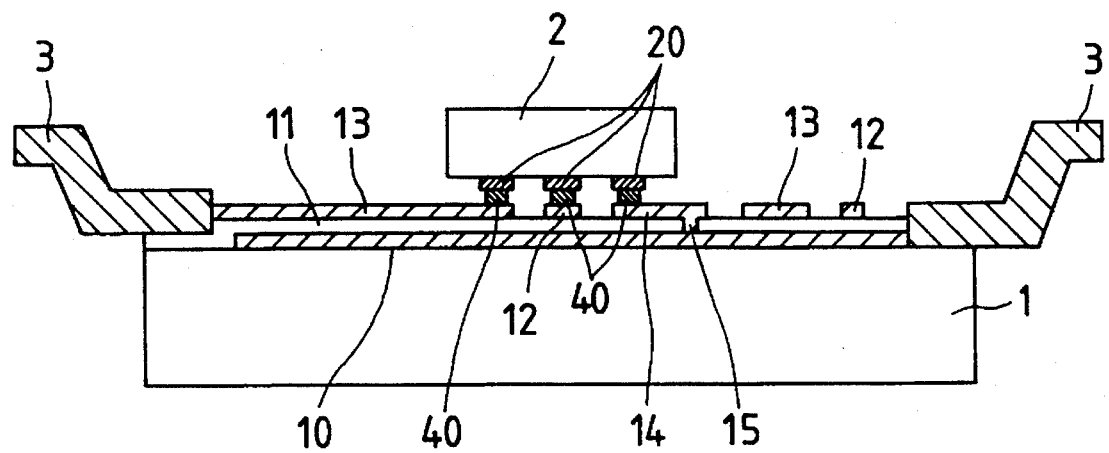
FIG. 1 is a sectional view of a semiconductor device according to a first embodiment of this invention.

With reference to FIG. 1, a semiconductor device includes a substrate 1 made of Si or glass. A ground conductor or ground plane 10 made of AlSiCu is formed on the substrate 1. An inter-layer insulating film 11 is formed on the ground conductor 10 and the substrate 1 by plasma CVD. The inter-layer insulating film 11 can be a dielectric film. Wiring conductors 12, 13, and 14 are formed on the inter-layer insulating film 11. Each of the wiring conductors 12, 13, and 14 includes, for example, a laminate of a titanium layer and a gold layer. A contact hole 15 extends through the inter-layer insulating film 11. The wiring conductor 14 and the ground conductor 10 are connected by a conductor extending in the contact hole 15.

The substrate 1, the ground conductor 10, the inter-layer insulating film 11, and the wiring conductors 12, 13, and 14 compose a wiring circuit board containing passive elements and transmission lines. Specifically, the wiring conductor 12, the inter-layer insulating film 11, and the ground conductor 10 compose a microstrip transmission line of a thin-film configuration. The wiring conductor 13, the inter-layer insulating film 11, and the ground conductor 10 compose a capacitor of a metal-insulator-metal (MIM) type. The wiring conductor 14 is grounded via the connection with the ground conductor 10 at the contact hole 15.

A semiconductor chip 2 includes a high-frequency transistor, a GaAs compound semiconductor element, or a heterojunction semiconductor element. The semiconductor chip 2 is provided with wiring lines 20. The wiring lines 20 on the semiconductor chip 2 are bonded to the wiring conductors 12, 13, and 14 via electrically-conductive bumps 40 in a flip-chip manner. Lead frames 3 for a mounting purpose are attached to the substrate 1.

The microstrip transmission line is formed by a semiconductor IC wiring line forming process. According to this process, high accuracies are available in the size and the location of the microstrip transmission line. The microstrip transmission line composed of the ground conductor 10, the inter-layer insulating film 11, and the wiring conductor 12 does not include the substrate 1 so that the microstrip transmission line can be formed regardless of the type of the substrate 1. Accordingly, the substrate 1 can be made of inexpensive material such as Si or glass. On the other hand, the substrates of prior-art MMIC's tend to be expensive. The semiconductor device may be of the surface-mounted type or the lead-less type.

The connection between the semiconductor chip 2 and the wiring conductors 12, 13, and 14 via the bumps 40 enables parasitic reactances to be small. Thus, reliable operation of the high-frequency transistor in the semiconductor chip 2 is ensured.

Before the semiconductor chip 2 is bonded to the wiring circuit board, it is possible to check the semiconductor chip 2 and the parts on the wiring circuit board independently.

DESCRIPTION OF THE SECOND PREFERRED EMBODIMENT

Figure 2:
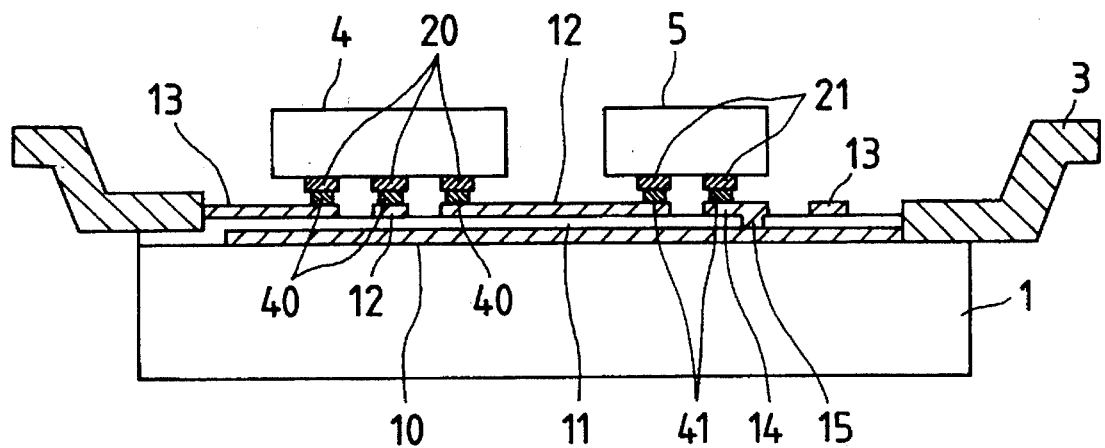
FIG. 2 is a sectional view of a semiconductor device according to a second embodiment of this invention.

With reference to FIG. 2, a semiconductor device includes a substrate 1 made of Si or glass. A ground conductor or ground plane 10 made of AlSiCu is formed on the substrate 1. An inter-layer insulating film 11 is formed on the ground conductor 10 and the substrate 1 by plasma CVD. The inter-layer insulating film 11 can be a dielectric film. Wiring conductors 12, 13, and 14 are formed on the inter-layer insulating film 11. Each of the wiring conductors 12, 13, and 14 includes, for example, a laminate of a titanium layer and a gold layer. A contact hole 15 extends through the inter-layer insulating film 11. The wiring conductor 14 and the ground conductor 10 are connected by a conductor extending in the contact hole 15.

The substrate 1, the ground conductor 10, the inter-layer insulating film 11, and the wiring conductors 12, 13, and 14 compose a wiring circuit board containing passive elements and transmission lines. Specifically, the wiring conductor 12, the inter-layer insulating film 11, and the ground conductor 10 compose a microstrip transmission line of a thin-film configuration. The wiring conductor 13, the inter-layer insulating film 11, and the ground conductor 10 compose a capacitor of a metal-insulator-metal (MIM) type. The wiring conductor 14 is grounded via the connection with the ground conductor 10 at the contact hole 15.

A semiconductor chip 4 includes a high-frequency transistor, a GaAs compound semiconductor element, or a heterojunction semiconductor element. The semiconductor chip 4 is provided with wiring lines 20. The wiring lines 20 on the semiconductor chip 4 are bonded to the wiring conductors 12 and 13 via electrically-conductive bumps 40 in a flip-chip manner. A semiconductor chip 5 includes a high-frequency transistor, a GaAs compound semiconductor element, or a heterojunction semiconductor element. The semiconductor chip 5 is provided with wiring lines 21. The wiring lines 21 on the semiconductor chip 5 are bonded to the wiring conductors 12 and 14 via electrically-conductive bumps 41, in a flip-chip manner. Lead frames 3 for a mounting purpose are attached to the substrate 1.

The type of the transistor in the semiconductor chip 4 may be different from the type of the transistor in the semiconductor chip 5. Thus, it is possible to connect transistors of different types onto the wiring circuit board. The type of the transistor in the semiconductor chip 4 may be the same as the type of the transistor in the semiconductor chip 5.

The microstrip transmission line is formed by a semiconductor IC wiring line forming process. According to this process, high accuracies are available in the size and the location of the microstrip transmission line.

Also, the semiconductor device of this embodiment has advantages similar to those of the semiconductor device in the embodiment of FIG. 1.

DESCRIPTION OF THE THIRD PREFERRED EMBODIMENT

Figure 3:
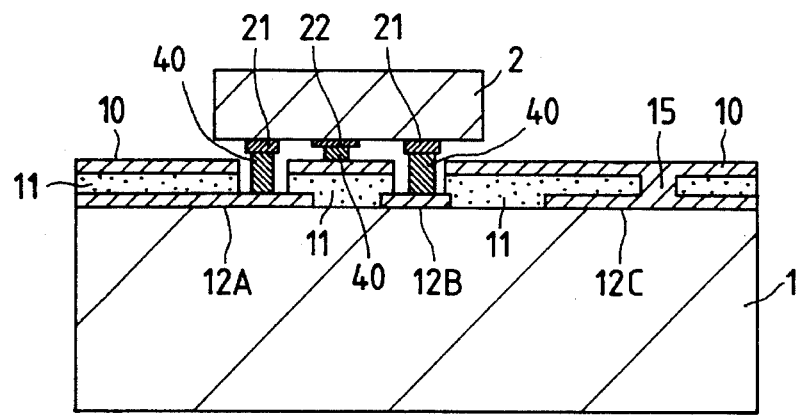
FIG. 3 is a sectional view of a semiconductor device according to a third embodiment of this invention.

With reference to FIG. 3, a semiconductor device includes a substrate 1 made of glass. Wiring conductors 12A, 12B, and 12C are formed on the substrate 1. Each of the wiring conductors 12A, 12B, and 12C includes, for example, a laminate of a titanium layer and a gold layer. An inter-layer insulating film 11 is formed on the wiring conductors 12A, 12B, and 12C and the substrate 1 by plasma CVD. The inter-layer insulating film 11 can be a dielectric film. A ground conductor or ground plane 10 made of AiSiCu is formed on the inter-layer insulating film 11. A contact hole 15 extends through the inter-layer insulating film 11. The wiring conductor 12C and the ground conductor 10 are connected by a conductor extending in the contact hole 15.

The substrate 1, the ground conductor 10, the inter-layer insulating film 11, and the wiring conductors 12A, 12B, and 12C compose a wiring circuit board containing passive elements and transmission lines. Specifically, the wiring conductor 12B, the inter-layer insulating film 11, and the ground conductor 10 compose a microstrip transmission line of a thin-film configuration. The wiring conductor 12A, the inter-layer insulating film 11, and the ground conductor 10 compose a capacitor of a metal-insulator-metal (MIM) type. The wiring conductor 12C is grounded via the connection with the ground conductor 10 at the contact hole 15.

A semiconductor chip 2 includes a high-frequency transistor, a GaAs compound semiconductor element, or a heterojunction semiconductor element. The semiconductor chip 2 is provided with signal wiring lines 21 and a grounding line 22. The wiring lines 21 on the semiconductor chip 2 are bonded, in a flip-chip manner, to the wiring conductors 12A and 12B via electrically-conductive bumps 40 disposed in holes through the ground conductor 10 and the inter-layer insulating film 11. The grounding line 22 on the semiconductor chip 2 is bonded to the ground conductor 10 via an electrically-conductive bump 40 in a flip-chip manner.

Since the ground conductor 10 is located between the wiring lines 21 on the semiconductor chip 2 and the wiring conductors 12A and 12B on the substrate 1, each wiring line 21 on the semiconductor chip 2 can be decoupled or uncoupled from the wiring conductors to which it is not electrically connected, 12A or 12B on the substrate 1. This is advantageous in preventing unwanted induction or transmission of signals between the wiring lines 21 on the semiconductor chip 2 and the wiring conductors 12A and 12B on the substrate 1.

The substrate I may be made of electrically-conductive material such as heavily-doped silicon. In this case, it is preferable to provide an insulating film between the substrate 1 and the wiring conductors 12A, 12B, and 12C.

The microstrip transmission line is formed by a semiconductor IC wiring line forming process. According to this process, high accuracies are available in the size and the location of the microstrip transmission line.

Also, the semiconductor device of this embodiment has advantages similar to those of the semiconductor device in the embodiment of FIG. 1.

DESCRIPTION OF THE FOURTH PREFERRED EMBODIMENT

Figure 4:
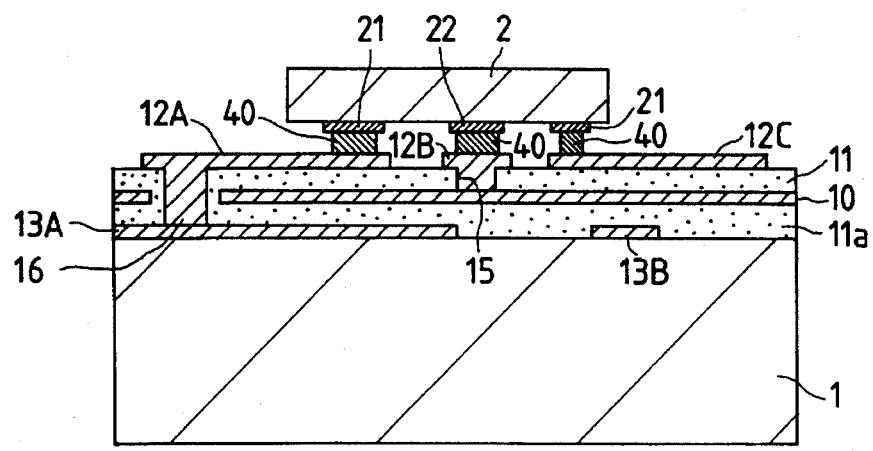
FIG. 4 is a sectional view of a semiconductor device according to a fourth embodiment of this invention.

With reference to FIG. 4, a semiconductor device includes a substrate 1 made of glass. Lower wiring conductors 13A and 13B are formed on the substrate 1. Each of the wiring conductors 13A and 13B includes, for example, a laminate of a titanium layer and a gold layer. A lower inter-layer insulating film 11a is formed on the lower wiring conductors 13A and 13B and the substrate 1 by plasma CVD. The lower inter-layer insulating film 11a can be a dielectric film. A ground conductor or ground plane 10 made of AISiCu is formed on the lower inter-layer insulating film 11a.

An upper inter-layer insulating film 11 is formed on the ground conductor 10 by plasma CVD. The upper inter-layer insulating film 11 can be a dielectric film. Wiring conductors 12A, 12B, and 12C are formed on the upper inter-layer insulating film 11. Each of the wiring conductors 12A, 12B, and 12C includes, for example, a laminate of a titanium layer and a gold layer.

A contact hole 15 extends through the upper inter-layer insulating film 11. The upper wiring conductor 12B extends into the contact hole 15, and contacts the ground conductor 10. A contact hole 16 extends through the upper and lower inter-layer insulating films 11 and 11a. The upper wiring conductor 12A extends into the contact hole 16, and contacts the lower wiring conductor 13A.

The substrate 1, the ground conductor 10, the lower inter-layer insulating films 11a, the upper inter-layer insulating film 11, the lower wiring conductors 13A and 13B, and the upper wiring conductors 12A, 12B, and 12C compose a wiring circuit board of a two-layer microstrip configuration which contains passive elements and transmission lines. Specifically, the lower wiring conductors 13A and 13B, the lower inter-layer insulating film 11a, and the ground conductor 10 compose a microstrip transmission line of a thin-film configuration or a capacitor of a metal-insulator-metal (MIM) type. The upper wiring conductors 12a, 12B, and 12C, the upper inter-layer insulating film 11, and the ground conductor 10 compose a microstrip transmission line of a thin-film configuration or a capacitor of a metal-insulator-metal (MIM) type. The upper wiring conductor 12B is grounded via the connection with the ground conductor 10 at the contact hole 15. The upper wiring conductor 12A and the lower wiring conductor 13A are connected via the contact hole 16.

A semiconductor chip 2 includes a high-frequency transistor, a GaAs compound semiconductor element, or a heterojunction semiconductor element. The semiconductor chip 2 is provided with signal wiring lines 21 and a grounding line 22. The wiring lines 21 on the semiconductor chip 2 are bonded to the upper wiring conductors 12A and 12C via electrically-conductive bumps 40 in a flip-chip manner. The grounding line 22 on the semiconductor chip 2 is bonded to the upper wiring conductor 12B via an electrically-conductive bump 40 in a flip-chip manner. It should be noted that the upper wiring conductor 12B is connected to the ground conductor 10 via the contact hole 15.

Since the ground conductor 10 is located between the upper wiring conductors 12A, 12B, and 12C and the lower wiring conductors 13A and 13B, each upper wiring conductor 12A, 12B, and 12C can be decoupled or uncoupled from the lower wiring conductors to which it is not electrically connected, 13A or 13B. This is advantageous in preventing unwanted induction or transmission of signals between the upper wiring conductors 12A, 12B, and 12C and the lower wiring conductors 13A and 13B.

The substrate 1 may be made of electrically-conductive material such as heavily-doped silicon. In this case, it is preferable to provide an insulating film between the substrate 1 and the lower wiring conductors 13A and 13B.

The microstrip transmission lines are formed by a semiconductor IC wiring line forming process. According to this process, high accuracies are available in the sizes and the locations of the microstrip transmission lines.

Also, the semiconductor device of this embodiment has advantages similar to those of the semiconductor device in the embodiment of FIG. 1.

DESCRIPTION OF THE FIFTH PREFERRED EMBODIMENT

Figure 5:
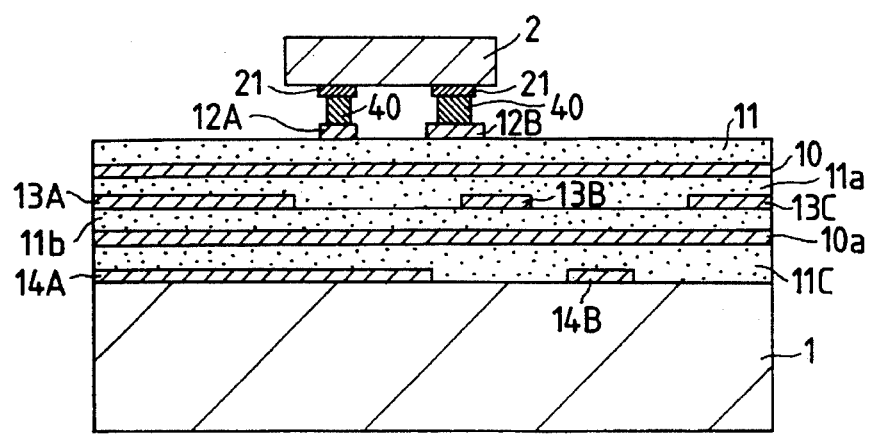
FIG. 5 is a sectional view of a semiconductor device according to a fifth embodiment of this invention.

FIG. 5 shows a fifth embodiment of this invention which is similar to the embodiment of FIG. 4 except for an additional arrangement indicated later.

A semiconductor device of FIG. 5 includes a substrate 1 made of glass. Lowermost wiring conductors 14A and 14B are formed on the substrate 1. A lowermost inter-layer insulating film 11c is formed on the lowermost wiring conductors 14A and 14B and the substrate 1. A lower ground conductor or ground plane 10a is formed on the lowermost inter-layer insulating film 11c.

A first intermediate inter-layer insulating film 11b is formed on the lower ground conductor 10a. Intermediate wiring conductors 13A, 13B, and 13C are formed on the first intermediate inter-layer insulating film 11b.

A second intermediate inter-layer insulating film 11a is formed on the intermediate wiring conductors 13A, 13B, and 13C and the first intermediate inter-layer insulating film 11b. An upper ground conductor or ground plane 10 is formed on the second intermediate inter-layer insulating film 11a.

An uppermost inter-layer insulating film 11 is formed on the upper ground conductor 10. Upper wiring conductors 12A and 12B are formed on the uppermost inter-layer insulating film 11.

A semiconductor chip 2 includes a high-frequency transistor. The semiconductor chip 2 is provided with wiring lines 21. The wiring lines 21 on the semiconductor chip 2 are bonded to the upper wiring conductors 12A and 12B via electrically-conductive bumps 40 in a flip-chip manner.

Connections among the upper wiring conductors 12A and 12B, the intermediate wiring conductors 13A, 13B, and 13C, and the lower wiring conductors 14A and 14B can be provided by conductors in contact holes (not shown).

DESCRIPTION OF THE SIXTH PREFERRED EMBODIMENT

Figure 6:
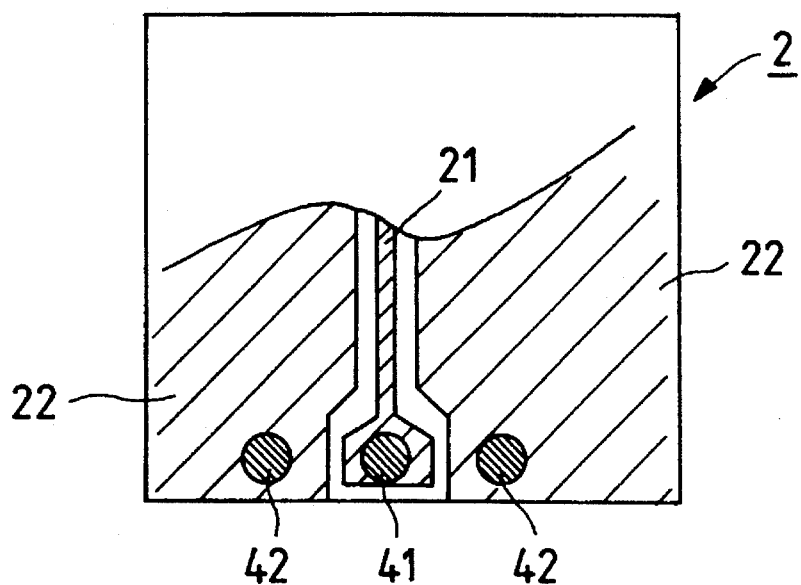
FIG. 6 is a plan view of a semiconductor chip in a sixth embodiment of this invention.

As shown in FIG. 6, a signal wiring line 21 and grounding lines 22 are formed on a semiconductor chip 2. The wiring line 21 and the grounding lines 22 are in a co-planar line configuration. The wiring line 21 is provided with an electrically-conductive bump 41. The grounding lines are provided with electrically-conductive bumps 42. The bumps 41 and 42 are formed by a suitable process such as a plating process or a stud-bump making process.

Figure 7:
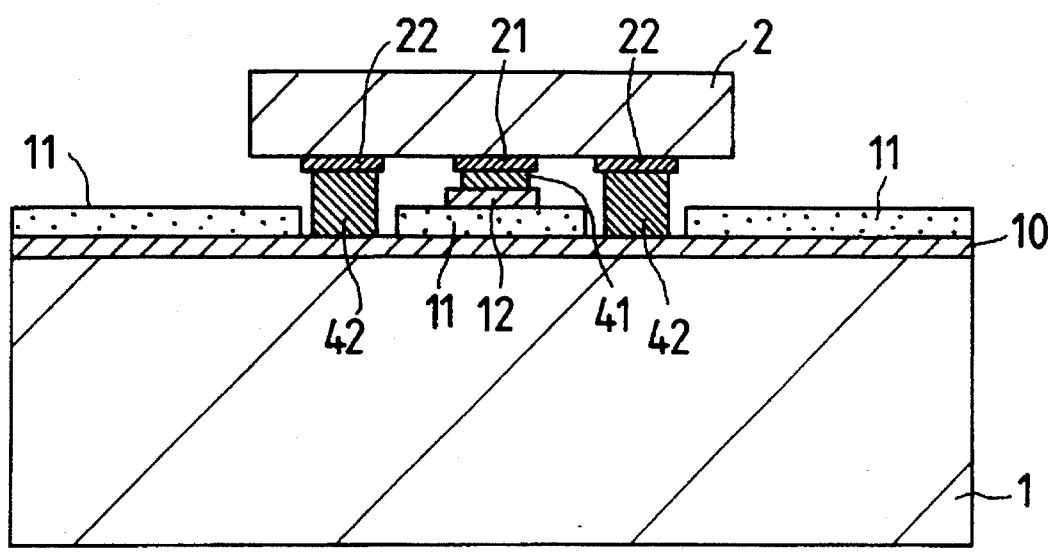
FIG. 7 is a sectional view of a semiconductor device according to the sixth embodiment of this invention.

With reference to FIG. 7, a semiconductor device includes a substrate 1 made of Si or glass. A ground conductor or ground plane 10 made of AlSiCu is formed on the substrate 1. An inter-layer insulating film 11 is formed on the ground conductor 10 by plasma CVD. The inter-layer insulating film 11 can be a dielectric film. A wiring conductor 12 is formed on the inter-layer insulating film 11. The wiring conductor 12 includes, for example, a laminate of a titanium layer and a gold layer.

The substrate 1, the ground conductor 10, the inter-layer insulating film 11, and the wiring conductor 12 compose a wiring circuit board containing a passive element or a transmission line. Specifically, the wiring conductor 12, the inter-layer insulating film 11, and the ground conductor 10 compose a microstrip transmission line of a thin-film configuration.

The semiconductor chip 2 includes a high-frequency transistor, a GaAs compound semiconductor element, or a heterojunction semiconductor element. As previously described, the semiconductor chip 2 is provided with the wiring line 21 and the grounding lines 22. The wiring line 21 on the semiconductor chip 2 is bonded to the wiring conductor 12 via the bump 41. The grounding lines 22 on tile semiconductor chip 2 are bonded to the ground conductor 10 via the bumps 42 which are located in holes through the inter-layer insulating film 11. The heights of the bumps 41 and 42 are suitably chosen according to the vertical positions of the upper surfaces of the wiring conductor 12 and the ground conductor 10.

Good impedance matching is available in the connection between the semiconductor chip 2 and the wiring circuit board. Thus, signals can be transmitted between circuit elements on the semiconductor chip 2 and the wiring circuit board under efficient and good impedance-matched conditions.

Also, the semiconductor device of this embodiment has advantages similar to those of the semiconductor device in the embodiment of FIG. 1.

DESCRIPTION OF THE SEVENTH PREFERRED EMBODIMENT

Figure 8:
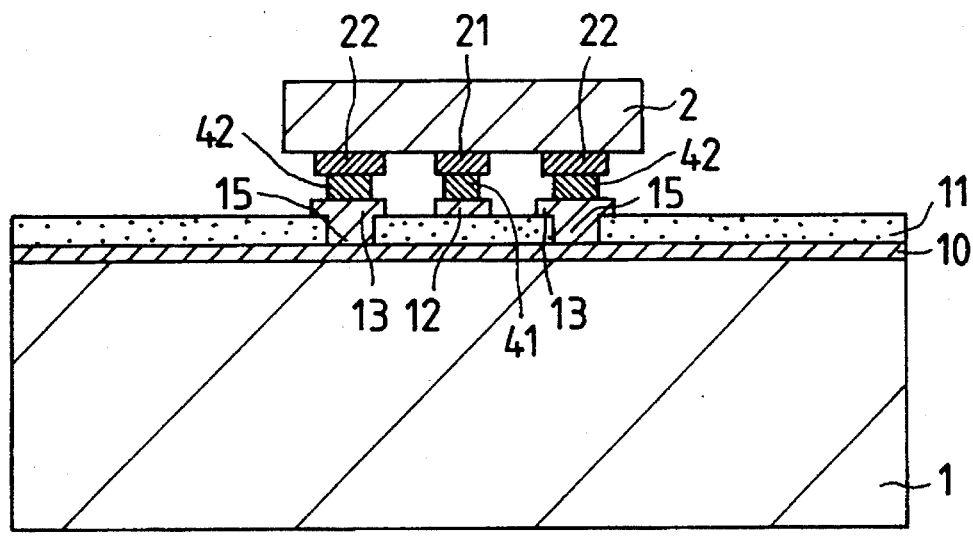
FIG. 8 is a sectional view of a semiconductor device according to a seventh embodiment of this invention.

FIG. 8 shows a seventh embodiment of this invention which is similar to the embodiment of FIG. 7 except for design changes indicated later.

In the embodiment of FIG. 8, wiring conductors 12 and 13 are formed on an inter-layer insulating film 11. The inter-layer insulating film 11 has contact holes 15. The wiring conductors 13 extend into the contact holes 15, and contact a ground conductor 10.

A wiring line 21 on a semiconductor chip 2 is provided with an electrically-conductive bump 41. Grounding lines 22 on the semiconductor chip 32 are prodded with electrically-conductive bumps 42. The bumps 41 and 42 have equal heights.

The wiring line 21 on the semiconductor chip 2 is bonded to the wiring conductor 12 via the bump 41. The grounding lines 22 on the semiconductor chip 2 are bonded to the wiring conductors 13 via the bumps 42. It should be noted that the wiring conductors 13 lead to the ground conductor 10.

DESCRIPTION OF THE EIGHTH PREFERRED EMBODIMENT

Figure 9:
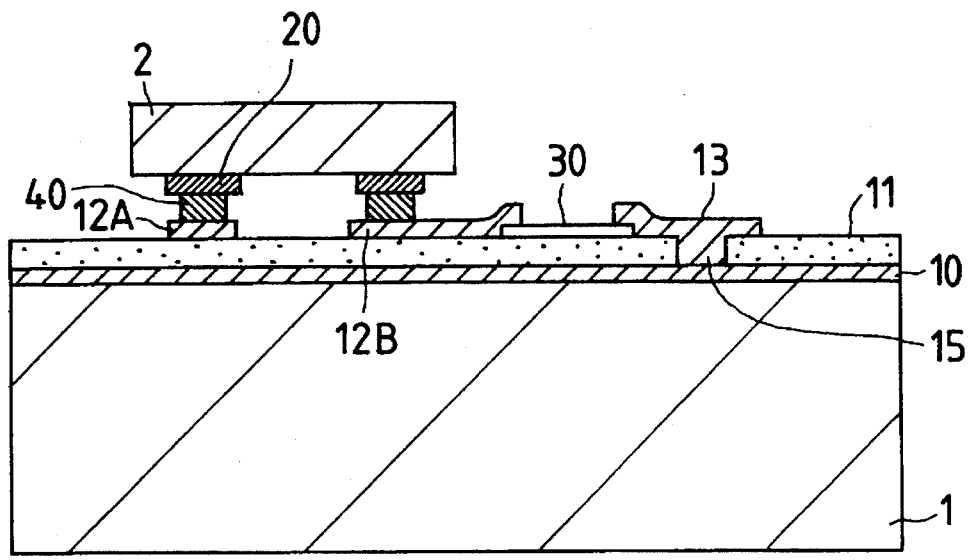
FIG. 9 is a sectional view of a semiconductor device according to an eighth embodiment of this invention.

With reference to FIG. 9, a semlconductor device includes a substrate 1 made of Si. A ground conductor or ground plane 10 made of AlSiCu is formed on the substrate 1. An inter-layer insulating film 11 made of $SiO_2$ is formed on the ground conductor 10 by plasma CVD. Wiring conductors 12A, 12B, and 13 are formed on the inter-layer insulating film 11. Each of the wiring conductors 12A, 12B, and 13 includes, for example, a laminate of a titanium layer and a gold layer. A contact hole 15 extends through the inter-layer insulating film 11. The wiring conductor 13 and the ground conductor 10 are connected by a conductor extending in the contact hole 15. An NiCr resistor 30 is formed on the inter-layer insulating film 11. The NiCr resistor 30 is connected between the wiring conductors 12B and 13.

The substrate 1, the ground conductor 10, the inter-layer insulating film 11, the wiring conductors 12A, 12B, and 13, and the NiCr resistor 30 compose a wiring circuit board containing passive elements and transmission lines. Specifically, the wiring conductors 12A and 12B, the inter-layer insulating film 11, and the ground conductor 10 compose microstrip transmission lines of a thin-film configuration. The NiCr resistor 30 is a terminating resistor connected between the wiring conductor 12B and the ground conductor 10 via the wiring conductor 13. The NiCr resistor 30 may be used for another purpose. The wiring conductor 13 is grounded via the connection with the ground conductor 10 at the contact hole 15.

A semiconductor chip 2 includes a high-frequency transistor, a GaAs compound semiconductor element, or a heterojunction semiconductor element. The semiconductor chip 2 is provided with wiring lines 20. The wiring lines 20 on the semiconductor chip 2 are bonded to the wiring conductors 12A and 12B via electrically-conductive bumps 40 in a flip-chip manner.

The microstrip transmission lines are formed by a semiconductor IC wiring line forming process. According to this process, high accuracies are available in the sizes and the locations of the microstrip transmission lines.

Also, the semiconductor device of this embodiment has advantages similar to those of the semiconductor device in the embodiment of FIG. 1.

DESCRIPTION OF THE NINTH PREFERRED EMBODIMENT

A ninth embodiment of this invention relates to a modification of one of the embodiments of FIGS. 1–9. According to the ninth embodiment, a semiconductor chip and a microstrip wiring lines are connected by a flip-chip bonding technology using resin. In addition, bumps for the connection between the semiconductor chip and the microstrip wiring lines are formed by a suitable process such as a stud-bump making process, a micro-bump making process, or a plating process.

DESCRIPTION OF THE TENTH PREFERRED EMBODIMENT

Figure 10:
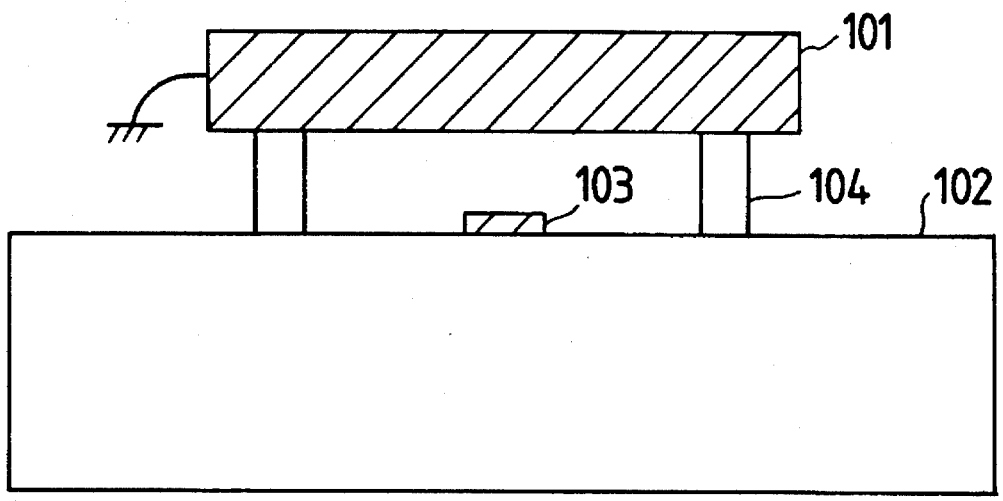
FIG. 10 is a sectional view of a transmission line device according to a tenth embodiment of this invention.

With reference to FIG. 10, a transmission line device includes a ground conductor or ground plane 101. The ground conductor 101 has a substrate made of electrically-conductive material such as silicon containing impurity at a high concentration. The ground conductor 101 may be made of usual metal. A dielectric member 102 extends parallel with the ground conductor 101. The dielectric member 102 is spaced from the ground conductor 101 by a predetermined gap. A central conductor 103 extending on the dielectric member 102 is located between the ground conductor 101 and the dielectric member 102. The central conductor 103 is spaced from the ground conductor 101 by a predetermined gap. Bumps 104 extend between the ground conductor 101 and the dielectric member 102. The central conductor 103 is located between the bumps 104. The bumps 104 are horizontally spaced from the central conductor 103 by a predetermined distance which is chosen so that the bumps 104 and the central conductor 103 can be prevented from interfering with each other.

The transmission line device of FIG. 10 is fabricated as follows. The central conductor 103 is formed on the dielectric member 102. The bumps 104 are provided on the dielectric member 102. Finally, the ground conductor 101 is bonded to the bumps 104 in a flip-chip manner.

The central conductor 103 and the ground conductor 101 compose a microstrip transmission line for a high-frequency signal. The central conductor 103 extends along the longitudinal direction of the transmission line. The central conductor 103 has a predetermined width which depends on the line resistance. The ground conductor 101 is spaced from the dielectric member 102 by a predetermined distance equal to the height of the bumps 104. The ground conductor 101 has a predetermined size chosen so that the ground conductor 101 can serve as an effective ground plane.

In the case where the height of the bumps 104 is equal to 10 µm and the relative dielectric constant of the dielectric member 102 is equal to 1, the characteristic impedance of the transmission line is equal to 50 Ω when the line width (the width of the central conductor 103) is equal to about 46 µm. In this case, a high-frequency signal in a millimeter wave band can be propagated along the transmission line while being in a quasi-TEM mode.

In the transmission line, dielectric material between the central conductor 103 and the ground conductor 101 is air which provides a negligible dielectric loss. Therefore, the transmission line is low in loss. The ground conductor 101 shields the central conductor 103 and thus prevents the central conductor 103 from being adversely affected by circuit elements or other conductors located above the ground conductor 101.

The surface of the central conductor 103 which faces the dielectric member 102 may be U-shaped in cross-section (not shown) to suppress the current concentration in the central conductor 103. In this case, the transmission line is lower in loss.

DESCRIPTION OF THE ELEVENTH PREFERRED EMBODIMENT

Figure 11:
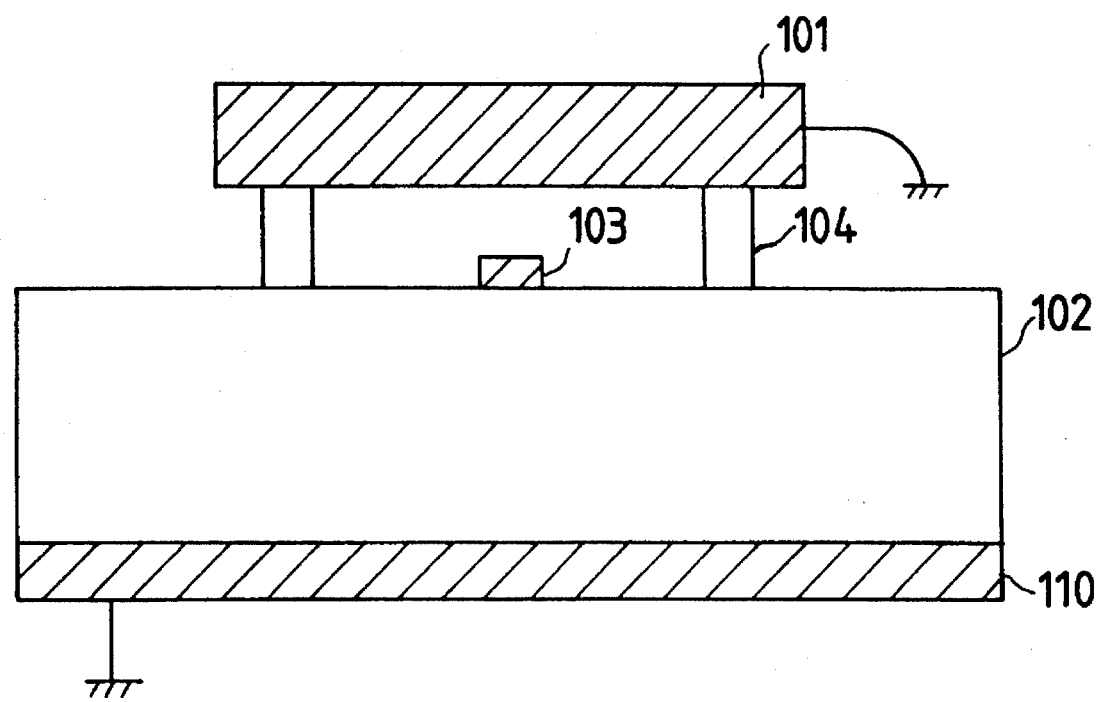
FIG. 11 is a sectional view of a transmission line device according to an eleventh embodiment of this invention.

FIG. 11 shows an eleventh embodiment of this invention which is similar to the embodiment of FIG. 10 except that a ground conductor or ground plane 110 is formed on a lower surface of a dielectric member 102 which is remotely located from a central conductor 103.

Since the central conductor 103 is sandwiched between a ground conductor 101 and the ground conductor 110, radiation loss in a transmission line can be decreased.

DESCRIPTION OF THE TWELFTH PREFERRED EMBODIMENT

Figure 12:
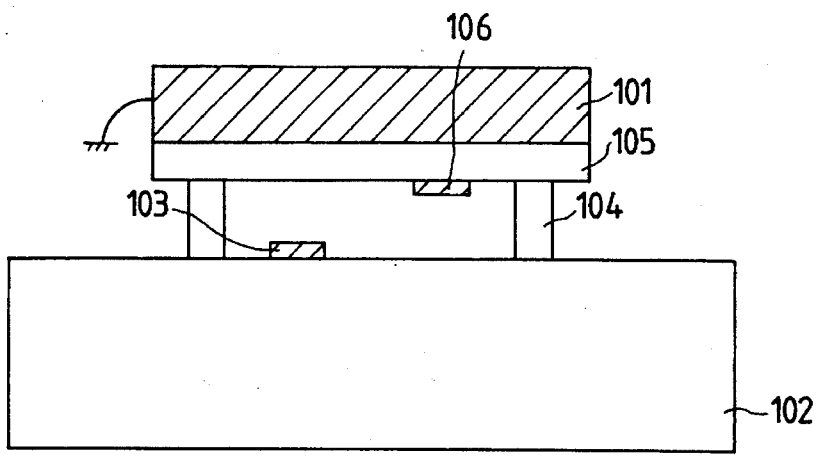
FIG. 12 is a sectional view of a transmission line device according to a twelfth embodiment of this invention.

With reference to FIG. 12, a transmission line device includes a ground conductor or ground plane 101. The ground conductor 101 has a substrate made of electrically-conductive material such as silicon containing impurity at a high concentration. The ground conductor 101 may be made of usual metal. A dielectric film 105 is formed on a lower surface of the ground conductor 101. The dielectric film 105 may be a silicon nitride film or a silicon oxide film.

A dielectric member 102 extends parallel with the ground conductor 101. The dielectric member 102 is spaced from the dielectric film 105 on the ground conductor 101 by a predetermined gap. A central conductor 103 extending on the dielectric member 102 is located between the dielectric film 105 and the dielectric member 102. The central conductor 103 is spaced from the dielectric film 105 by a predetermined gap. Bumps 104 extend between the dielectric film 105 and the dielectric member 102. The central conductor 103 is located between the bumps 104. The bumps 104 are horizontally spaced from the central conductor 103 by predetermined distances which are chosen so that the bumps 104 and the central conductor 103 can be prevented from interfering with each other.

A central conductor 106 extending on the dielectric film 105 is located between the dielectric film 105 and the dielectric member 102. The central conductor 106 is spaced from the dielectric member 102 by a predetermined gap. The central conductor 106 is located between the bumps 104.

The transmission line device of FIG. 12 is fabricated as follows. The dielectric film 105 is formed on the surface of the ground conductor 101. The central conductor 106 is provided on the dielectric film 105. In this way, a combination of the ground conductor 101, the dielectronic film 105, and the central conductor 106 is made. Then, the central conductor 103 is formed on the dielectric member 102. The bumps 104 are provided on the dielectric member 102. Finally, the combination of the ground conductor 101, the dielectric film 105, and the central conductor 106 is bonded to the bumps 104 fin a flip-chip manner.

The central conductor 103 and the ground conductor 101 compose a microstrip transmission line for a high-frequency signal. The central conductor 103 extends along the longitudinal direction of the transmission line. The central conductor 103 has a predetermined width which depends on the line resistance. The dielectric film 105 on the ground conductor 101 is spaced from the dielectric member 102 by a predetermined distance equal to the height of the bumps 104. The ground conductor 101 has a predetermined size chosen so that the ground conductor 101 can serve as an effective ground plane.

The central conductor 106 and the ground conductor 101 compose a microstrip transmission line for a high-frequency signal. The central conductor 106 extends along the longitudinal direction of the transmission line. The central conductor 106 has a predetermined width which depends on the line resistance.

It is assumed that the height of the bumps 104 is equal to 10 μm and the relative dielectric constant of the dielectric member 102 is equal to 1. In addition, the thickness of the dielectric film 105 is equal to 5 μm and the relative dielectric constant of the dielectric film 105 is equal to 4. Under these conditions, the characteristic impedance of the transmission line including the central conductor 103 is equal to 50 Ω when the line width (the width of the central, conductor 103) is equal to about 50 μm. In addition, the characteristic impedance of the transmission line including the central conductor 106 is equal to 50 Ω when the line width (the width of the central conductor 106) is equal to about 8 μm.

In the transmission line including the central conductor 103, dielectric material between the central conductor 103 and the ground conductor 101 contains air which provides a negligible dielectric loss. Therefore, the transmission line including the central conductor 103 is good in loss. In the transmission line including the central conductor 106, a space between the central conductor 106 and the ground conductor 101 is fully occupied by the dielectric film 105. Therefore, the transmission line including the central conductor 106 can be small in size.

DESCRIPTION OF THE THIRTEENTH PREFERRED EMBODIMENT

Figure 13:
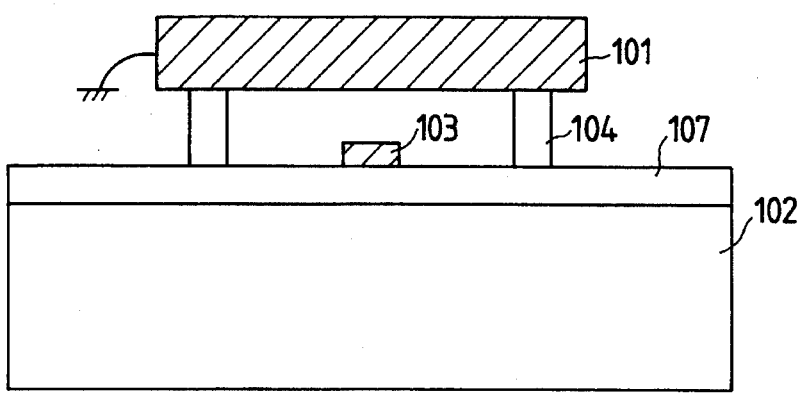
FIG. 13 is a sectional view of a transmission line device according to a thirteenth embodiment of this invention.

FIG. 13 shows a thirteenth .embodiment of this invention which is similar to the embodiment of FIG. 10 except that an upper surface of a dielectric member 102 is coated with a dielectric film 107 having a smooth or even surface. It should be noted that a rugged surface of a dielectric member tends to cause a loss in a transmission line. A central conductor 103 and bumps 104 are provided on the dielectric film 107.

The dielectric member 102 may be replaced by a metal member. Mother ground conductor may be provided on a lower surface of the dielectric member 102.

DESCRIPTION OF THE FOURTEENTH PREFERRED EMBODIMENT

Figure 14:
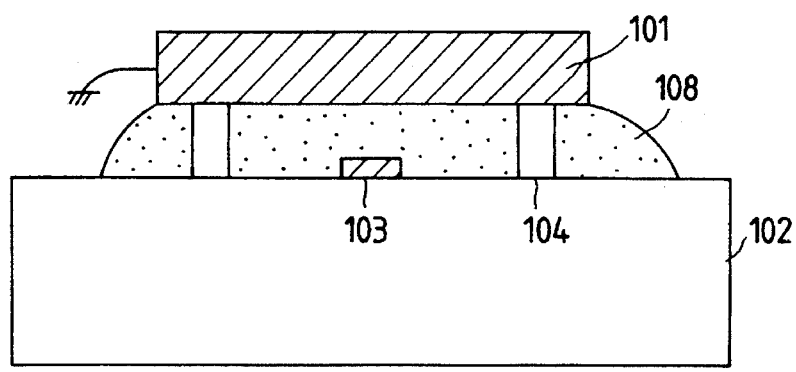
FIG. 14 is a sectional view of a transmission line device according to a fourteenth embodiment of this invention.

FIG. 14 shows a fourteenth embodiment of this invention which is similar to the embodiment of FIG. 10 except that a space between a ground conductor 101 and a dielectric member 102 is filled with dielectric material 108. A central conductor 103 is embedded in a block of the dielectric material 108. The block of the dielectric material 108 serves as a protector for the central conductor 103. In addition, the block of the dielectric material 108 isolates the central conductor 103 from air, and thus prevents the central conductor 103 from being oxidized by air. As the relative dielectric constant of the dielectric material 108 increases, a transmission line can be smaller.

A second ground conductor may be provided on a lower surface of the dielectric member 102.

DESCRIPTION OF THE FIFTEENTH PREFERRED EMBODIMENT

Figure 15:
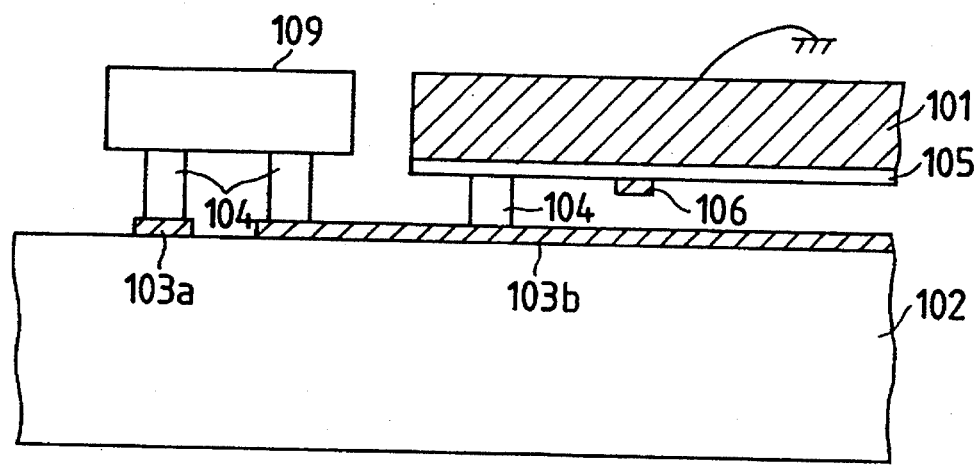
FIG. 15 is a sectional view of a transmission line device according to a fifteenth embodiment of this invention.

FIG. 15 shows a fifteenth embodiment of this invention which is similar to the embodiment of FIG. 12 except for an additional arrangement indicated later.

In the embodiment of FIG. 15, a central conductor 103b formed on a dielectric member 102 extends into a region outward of a ground conductor 101 and forms a wiring conductor. Another wiring conductor 103a is formed on the dielectric member 102.

A semiconductor IC chip 109 including at least one active element is bonded to the wiring Conductors 103a and 103b via electrically-conductive bumps 104A in a flip-chip manner. Thus, the semiconductor IC chip 109 is connected to a microstrip transmission line composed of the central conductor 103b and the ground conductor 101. The semiconductor IC chip 109 is horizontally spaced from the ground conductor 101.

Before the semiconductor IC chip 109 is bonded to the wiring conductors 103a and 103b, it is possible to check the semiconductor IC chip 109 and the transmission line independently.

A second ground conductor may be provided on a lower surface of the dielectric member 102.

DESCRIPTION OF THE SIXTEENTH PREFERRED EMBODIMENT

Figure 16:
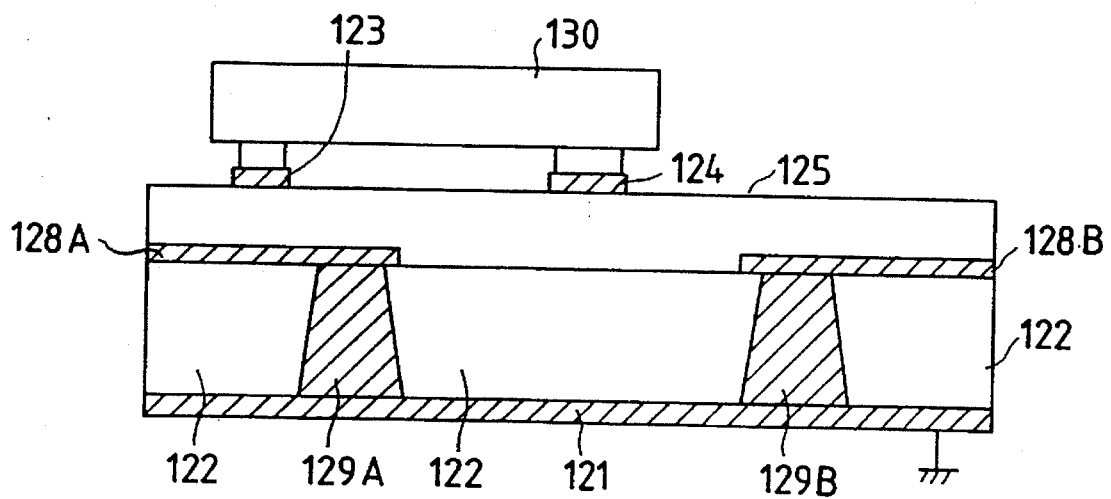
FIG. 16 is a sectional view of a transmission line device according to a sixteenth embodiment of this invention.

With reference to FIG. 16, a semiconductor device includes a ground conductor or ground plane 121 formed on a lower surface of a dielectric member 122. Metal films 128A and 128B are formed on an upper surface of the dielectric member 122. A dielectric film 125 is formed on the metal films 128A and 128B and a portion of the upper surface of the dielectric member 122. Central conductors 123 and 124 are formed on the dielectric film 125.

The dielectric member 122 has vertically-extending through holes 129A and 129B. The through hole 129A is occupied by a conductor which connects the metal film 128A and the ground conductor 121. Thus, the metal film 128A is grounded. The through hole 129B is occupied by a conductor which connects the metal film 128B and the ground conductor 121. Thus, the metal film 128B is grounded.

A GaAs substrate 130 provided with an FET is bonded to the central conductors 123 and 124 in a flip-chip manner.

The central conductor 123 extends directly above the metal film 128A so that the central conductor 123 and the metal film 128A compose a microstrip transmission line. It should be noted that the metal film 128A is grounded. The central conductor 124 extends directly above a region outside the metal films 128A and 128B. The central conductor 124 extends directly above the ground conductor 121. Accordingly, the central conductor 124 and the ground conductor 121 compose a microstrip transmission line.

Preferable conditions are as follows. The dielectric member 122 and the dielectric film 125 are laminated by a sputtering vapor deposition process. The dielectric member 122 is made of glass having a relative dielectric constant of 5. The dielectric member 122 has a thickness of 100 μm. The dielectric film 125 is made of silicon dioxide having a relative dielectric constant of 4. The dielectric film 125 has a thickness of 9 μm. The central conductors 123 and 124 are formed on the dielectric film 125 by a sputtering vapor deposition process. The central conductors 123 and 124 are made of gold. The central conductors 123 and 124 have a thickness of 3 μm.

Under the previously-indicated preferable conditions, the central conductor 123 and the metal film 128A are separated from each other by dielectric material having a thickness of 9 μm in the transmission line including the central conductor 123. In this case, the characteristic impedance of the transmission line is equal to 50 Ω when the width of the transmission line (the width of the central conductor 123) is equal to about 17 μm. The transmission line including the central conductor 123 is suited for miniaturization. Under the previously-indicated preferable conditions, the central conductor 124 and the ground conductor 121 are separated from each other by dielectric material having a thickness of about 110 μm in the transmission line including the central conductor 124. The transmission line including the central conductor 124 is low in loss.

When the GaAs FET 130 is used to form an amplifier, it is preferable that the central conductor 124 constitutes an input matching circuit while the central conductor 123 constitutes an output matching circuit.

When the GaAs FET 130 is used to form an oscillator, it is preferable that the central conductor 124 constitutes a resonator which enables a high signal-to-noise ratio in an output signal of the oscillator.

DESCRIPTION OF THE SEVENTEENTH PREFERRED EMBODIMENT

Figure 17:
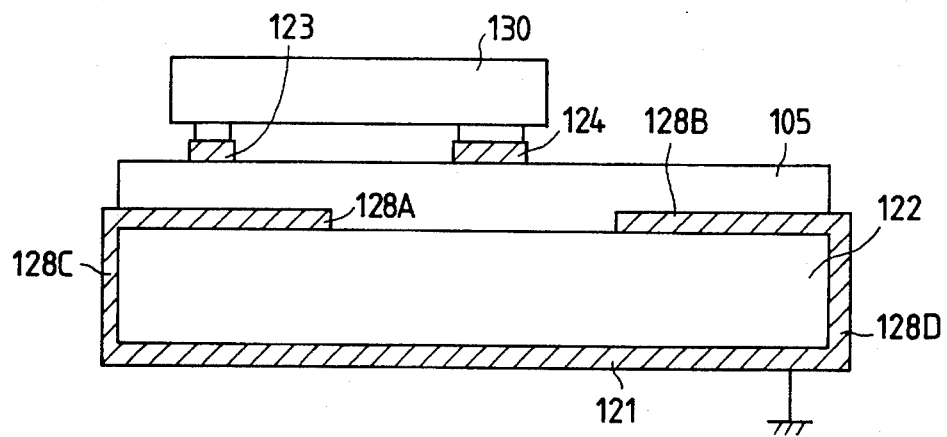
FIG. 17 is a sectional view of a transmission line device according to a seventeenth embodiment of this invention.

FIG. 17 shows a seventeenth embodiment of this invention which is similar to the embodiment of FIG. 16 except that metal rims 128A and 128B are connected to a ground conductor 121 via metal films 128C and 128D extending on end surfaces of a dielectric member 122. It is unnecessary to provide the dielectric member 122 with through holes.

DESCRIPTION OF THE EIGHTEENTH PREFERRED EMBODIMENT

Figure 18:
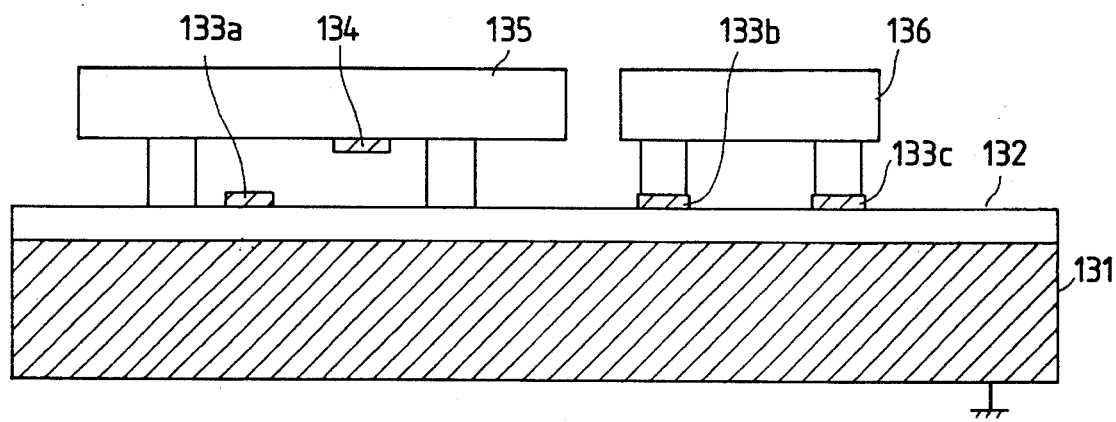
FIG. 18 is a sectional view of a transmission line device according to an eighteenth embodiment of this invention.

With reference to FIG. 18, a transmission line device includes a ground conductor or ground plane 131. The ground conductor 131 has a substrate made of electrically-conductive material such as p-type silicon containing impurity at a high concentration. The ground conductor 131 may be made of usual metal.

A dielectric film 132 made of $SiO_2$ is formed on the ground conductor 131. It is preferable that the dielectric film 132 has a thickness of 1 μm to 10 μm. The dielectric film 132 can be accurately formed by a usual semiconductor making apparatus. Central conductors 133a, 133b, and 133c which may be made of thin films of gold are formed on the dielectric film 132.

A dielectric member 135 is mounted on the dielectric film 132. The dielectric member 135 extends parallel with the dielectric film 132. The dielectric member 135 is spaced from the dielectric film 132 by a predetermined gap. A central conductor 134 formed on the dielectric member 135 is located between the dielectric member 135 and the dielectric film 132. The central conductor 134 is spaced from the dielectric film 132 by a predetermined gap.

A GaAs substrate 136 provided with an FET is bonded to the central conductors 133b and 133c in a flip-chip manner. Thus, a portion of wiring to the GaAs FET 136 is formed by the central conductors 133b and 133c.

The central conductor 133a and the ground conductor 131 compose a microstrip transmission line in which the central conductor 133a and the ground conductor 131 are separated from each other by the dielectric film 132. The central conductor 133b and the ground conductor 131 compose a microstrip transmission line in which the central conductor 133b and the ground conductor 131 are separated from each other by the dielectric film 132. The central conductor 133c and the ground conductor 131 compose a microstrip transmission line in which the central conductor 133c and the ground conductor 131 are separated from each other by the dielectric film 132. The transmission lines including the central conductors 133a, 133b, and 133c are suited for miniaturization.

A preferable example of setting of the transmission lines including the central conductors 133a, 133b, and 133c is as follows. In the case where the thickness of the dielectric film 132 is equal to 9 μm, the characteristic impedance of the transmission line is equal to 50 Ω when the line width (the width of the central conductors 133a, 133b, and 133c) is equal to about 17 μm. In this case, a high-frequency signal in a millimeter wave band can be propagated along the transmission lines while being in a quasi-TEM mode.

The central conductor 134 and the ground conductor 131 compose a microstrip transmission line in which the central conductor 134 and the ground conductor 131 are separated from each other by the dielectric film 132 and air. Since air provides a negligible dielectric loss, the transmission line including the central conductor 134 is good in loss.

The central conductor 134 may be formed on the GaAs substrate 136. In this case, the dielectric member 135 can be omitted (not shown). The FET on the GaAs substrate 136 may be replaced by an HBT or a HEMT. The GaAs substrate 136 may be replaced by a silicon substrate.

DESCRIPTION OF THE NINETEENTH PREFERRED EMBODIMENT

Figure 19:
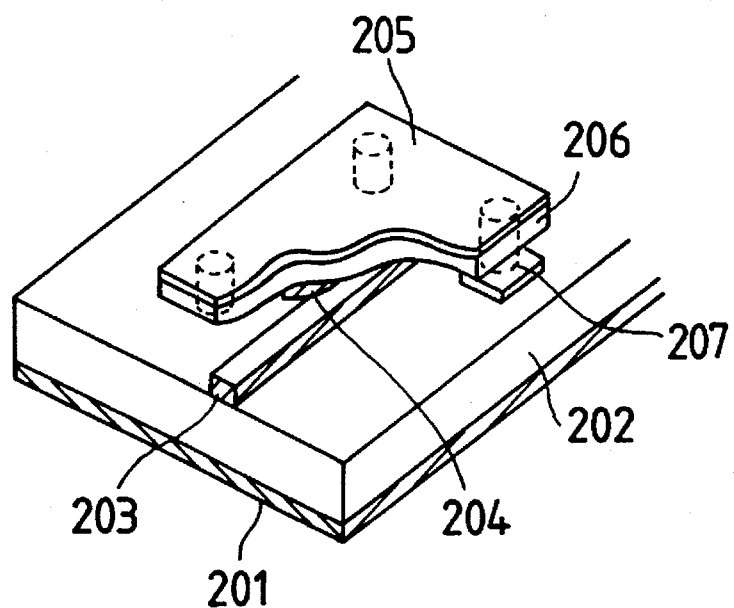
FIG. 19 is a partially cutaway view in perspective of a coupled line device according to a nineteenth embodiment of this invention.
Figure 20:
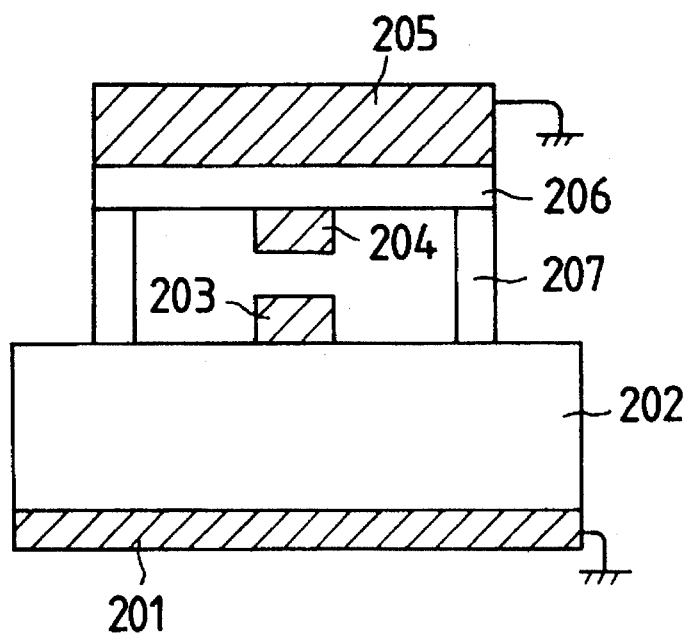
FIG. 20 is a sectional view of the coupled line device in FIG. 19.

With reference to FIGS. 19 and 20, a coupled line device includes a ground conductor or ground plane 201 formed on a lower surface of a dielectric member 202. The ground conductor 201 has a substrate made of electrically-conductive material such as silicon containing impurity at a high concentration. The ground conductor 201 may include a metal layer deposited on a semiconductor substrate (not shown). The dielectric member 202 is made of, for example, GaAs. The dielectric member 202 may include a silicon nitride film or a silicon oxide film (not shown). A central conductor 203 is formed on an upper surface of the dielectric member 202.

A ground conductor or ground plane 205 is mounted on the dielectric member 202 via bumps 207 in a flip-chip manner. A dielectric film 206 is formed on a lower surface of the ground conductor 205. The dielectric film 206 is made of, for example, GaAs. The dielectric film 206 may include a silicon nitride film or a silicon oxide film. A central conductor 204 is formed on the dielectric film 206. The bumps 207 extend between the dielectric member 202 and the dielectric film 206. The dielectric member 202 and the dielectric film 206 are separated from each other by a predetermined gap corresponding to the height of the bumps 207.

The central conductors 203 and 204 are located between the ground conductors 201 and 205. The dielectric member 202 extends between the ground conductor 201 and the central conductor 203. The dielectric film 206 extends between the central conductor 204 and the ground conductor 205. The central conductor 204 extends above and parallel with the central conductor 203. The central conductors 203 and 204 align with each other. The central conductors 203 and 204 have equal widths. The central conductors 203 and 204 are separated from each other by a predetermined gap.

The coupled line device of FIGS. 19 and 20 is fabricated as follows. After a combination of the ground conductor 201 and the dielectric member 202 is made, the central conductor 203 is formed on the dielectric member 202. In addition, the bumps 207 are provided on the dielectric member 202. The bumps 207 are horizontally spaced from the central conductor 203 by a predetermined distance which is chosen so that the bumps 207 and the central conductor 203 can be prevented from interfering with each other. In this way, a combination of the ground conductor 201, the dielectric member 202, the central conductor 203, and the bumps 207 is made. On the other hand, the dielectric film 206 is formed on the ground conductor 205. The central conductor 204 is formed on the dielectric film 206. In this way, a combination of the ground conductor 205, the dielectric film 206, and the central conductor 204 is made. The combination of the ground conductor 205, the dielectric film 206, and the central conductor 204 is mounted on the combination of the ground conductor 201, the dielectric member 202, the central conductor 203, and the bumps 207 in a flip-chip manner.

The central conductor 263 and the ground conductor 201 compose a microstrip transmission line in which the central conductor 203 and the ground conductor 201 are separated from each other by the dielectric member 202. The central conductor 203 extends along the longitudinal direction of the transmission line.

The central conductor 204 and the ground conductor 205 compose a microstrip transmission line in which the central conductor 204 and the ground conductor 205 are separated from each other by the dielectric film 206. The central conductor 204 extends along the longitudinal direction of the transmission line.

The transmission line including the central conductor 203 and the transmission line Including the central conductor 204 are coupled with each other via the parallel arrangement of the central conductors 203 and 204.

Preferable conditions are as follows. The height of the bumps 207 is equal to 10 μm. The relative dielectric constants of the dielectric member 202 and the dielectric film 206 are equal to about 1. The thickness of the dielectric member 202 is equal to 45 μm. Under these preferable conditions, when the line widths (the widths of the central conductors 203 and 204) are equal to about 70 μm, the characteristic impedances of the transmission lines are equal to 50 Ω and the degree of coupling between the transmission lines is equal to 2.4 dB. This coupling degree is sufficient for high-frequency signals in a millimeter wave band.

The degree of coupling between the transmission lines depends on the distance between the central conductors 203 and 204 and the height of the bumps 207. Thus, the degree of coupling can be easily adjusted by varying the height of the bumps 207. The central conductors 203 and 204 are separated from each other via air which provides a negligible dielectric loss. Therefore, the coupling between the transmission lines is low in loss.

DESCRIPTION OF THE TWENTIETH PREFERRED EMBODIMENT

Figure 21:
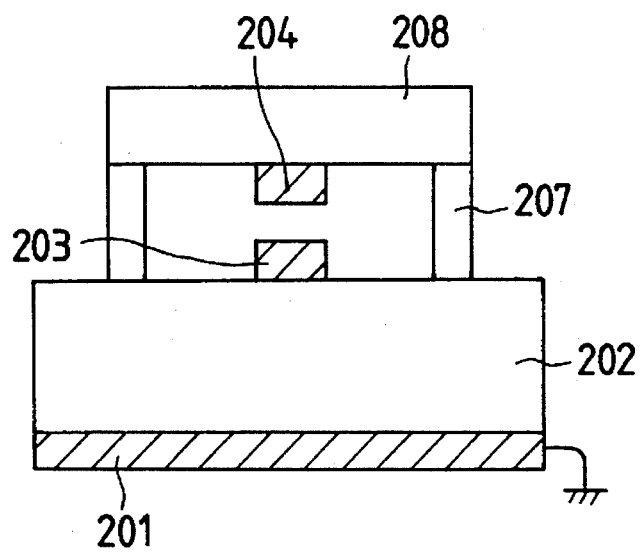
FIG. 21 is a sectional view of a coupled line device according to a twentieth embodiment of this invention.

With reference to FIG. 21, a coupled line device includes a ground conductor or ground plane 201 formed on a lower surface of a dielectric member 202. The ground conductor 201 has a substrate made of electrically-conductive material such as silicon containing impurity at a high concentration. The ground conductor 201 may include a metal, layer deposited on a semiconductor substrate. The dielectric member 202 is made of, for example, GaAs. The dielectric member 202 may include a silicon nitride film or a silicon oxide film. A central conductor 203 is formed on an upper surface of the dielectric member 202.

A dielectric member 208 is mounted on the dielectric member 202 via bumps 207 in a flip-chip manner. The dielectric member 208 is made of, for example, GaAs. The dielectric member 208 may include a silicon nitride film or a silicon oxide film. A central conductor 204 is formed on the dielectric member 208. The bumps 207 extend between the dielectric members 202 and 208. The dielectric members 202 and 208 are separated from each other by a predetermined gap corresponding to the height of the bumps 207.

The central conductors 203 and 204 are located above the ground conductor 201. The dielectric member 202 extends between the ground conductor 201 and the central conductor 203. The central conductor 204 extends above and parallel with the central conductor 203. The central conductors 203 and 204 align with each other. The central conductors 203 and 204 have equal widths. The central conductors 203 and 204 are separated from each other by a predetermined gap.

The coupled line device of FIG. 21 is fabricated as follows. After a combination of the ground conductor 201 and the dielectric member 202 is made, the central conductor 203 is formed on the dielectric member 202. In addition, the bumps 207 are provided on the dielectric member 202. The bumps 207 are horizontally spaced from the central conductor 203 by a predetermined distance which is chosen so that the bumps 207 and the central conductor 203 can be prevented from interfering with each other. In this way, a combination of the ground conductor 201, the dielectric member 202, the central conductor 203, and the bumps 207 is made. On the other hand, the central conductor 204 is formed on the dielectric member 208. In this way, a combination of the dielectric member 208 and the central conductor 204 is made. The combination of the dielectric member 208 and the central conductor 204 is mounted on the combination of the ground conductor 201, the dielectric member 202, the central conductor 203, and the bumps 207 in a flip-chip manner.

The central conductor 203 and the ground conductor 201 compose a microstrip transmission line in which the central conductor 203 and the ground conductor 201 are separated from each other by the dielectric member 202. The central conductor 203 extends along the longitudinal direction of the transmission line.

The central conductor 204 and the ground conductor 201 compose a microstrip transmission line in which the central conductor 204 and the ground conductor 201 are separated from each other by the dielectric film 206 and air. The central conductor 204 extends along the longitudinal direction of the transmission line.

The transmission line including the central conductor 203 and the transmission line including the central conductor 204 are coupled with each other via the parallel arrangement of the central conductors 203 and 204.

The degree of coupling between the transmission lines depends on the distance between the central conductors 203 and 204 and the height of the bumps 207. Thus, the degree of coupling can be easily adjusted by varying the height of the bumps 207. The central conductors 203 and 204 are separated from each other via air which provides a negligible dielectric loss; Therefore, the coupling between the transmission lines is low in loss.

DESCRIPTION OF THE TWENTY-FIRST PREFERRED EMBODIMENT

Figure 22:
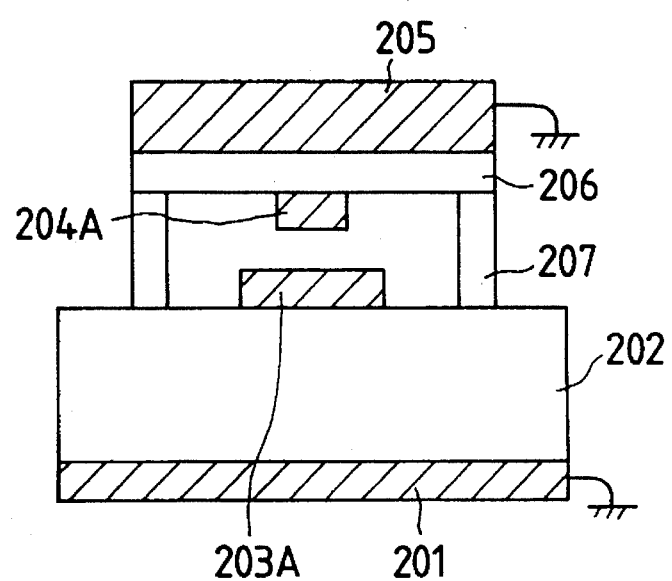
FIG. 22 is a sectional view of a coupled line device according to a twenty-first embodiment of this invention.

FIG. 22 shows a twenty-first embodiment of this invention which is similar to the embodiment of FIGS. 19 and 20 except that the central conductors 203 and 204 (see FIGS. 19 and 20) are replaced by central conductors 203A and 204A having different widths. The characteristic impedances of transmission lines including the central conductors 203A and 204A can be easily adjusted by varying the widths of the central conductors 203A and 204A.

DESCRIPTION OF THE TWENTY-SECOND PREFERRED EMBODIMENT

Figure 23:
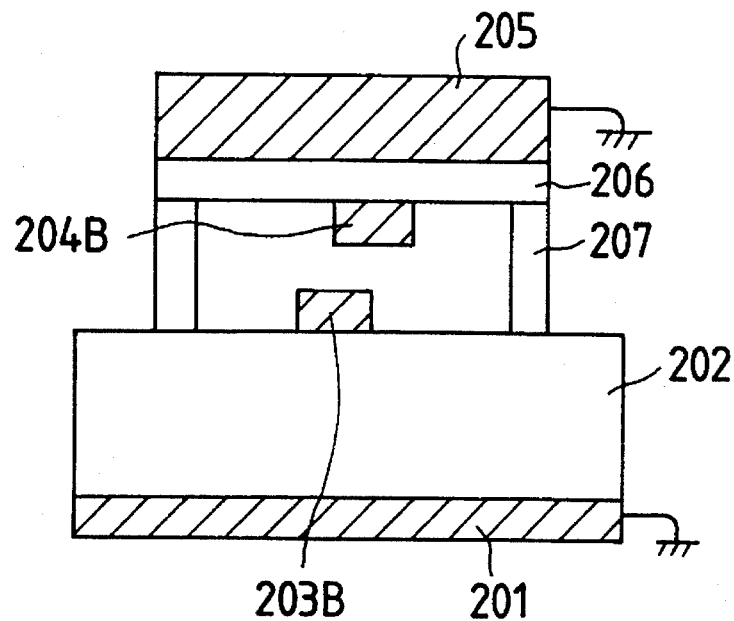
FIG. 23 is a sectional view of a coupled line device according to a twenty-second embodiment of this invention.

FIG. 23 shows a twenty-second embodiment of this invention which is similar to the embodiment of FIGS. 19 and 20 except that the central conductors 203 and 204 (see FIGS. 19 and 20) are replaced by central conductors 203B and 204B offset from each other. The degree of coupling between transmission lines including the central conductors 203B and 204B can be easily adjusted by varying the degree of offset between the central conductors 203B and 204B.

DESCRIPTION OF THE TWENTY-THIRD PREFERRED EMBODIMENT

Figure 24:
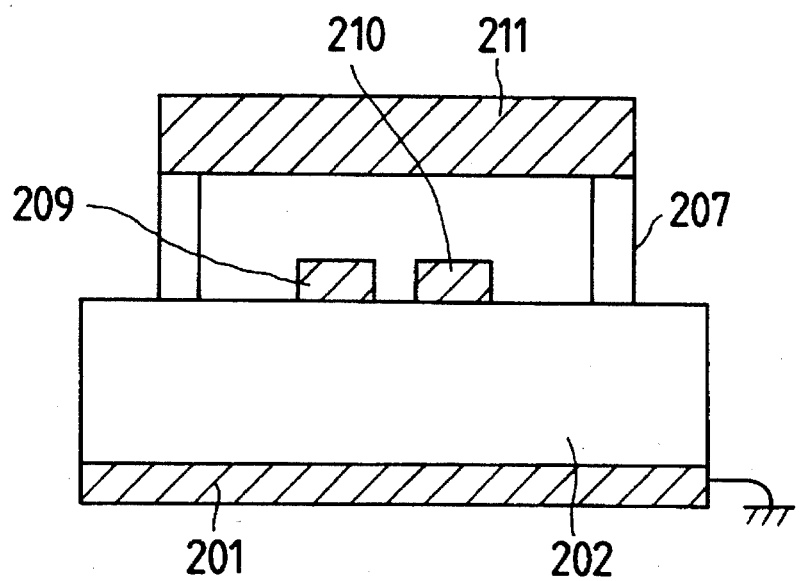
FIG. 24 is a sectional view of a coupled line device according a twenty-third embodiment of this invention.

With reference to FIG. 24, a coupled line device includes a ground conductor or ground plane 201 formed on a lower surface of a dielectric member 202. The ground conductor 201 has a substrate made of electrically-conductive material such as silicon containing impurity at a high concentration. The ground conductor 201 may include a metal layer deposited on a semiconductor substrate. The dielectric member 202 is made of, for example, GaAs. The dielectric member 202 may include a silicon nitride film or a silicon oxide film. Central conductors 209 and 210 are formed on an upper surface of the dielectric member 202. The central conductors 209 and 210 extend parallel with each other. The central conductors 209 and 210 are horizontally spaced from each other by a predetermined gap.

An overlay conductor 211 is mounted on the dielectric member 202 via bumps 207 in a flip-chip manner. The central conductors 209 and 210 are located between the ground conductor 201 and the overlay conductor 211. The central conductors 209 and 210 are spaced from the overlay conductor 211 by a predetermined gap.

The coupled line device of FIG. 24 is fabricated as follows. After a combination of the ground conductor 201 and the dielectric member 202 is made, the central conductors 209 and 210 are formed on the dielectric member 202. In addition, the bumps 207 are provided on the dielectric member 202. The bumps 207 are horizontally spaced from the central conductors 209 and 210 by predetermined distances which are chosen so that the bumps 207 and the central conductors 209 and 210 can be prevented from interfering with each other. In this way, a combination of the ground conductor 201, the dielectric member 202, the central conductors 209 and 210, and the bumps 207 is made. The overlay conductor 211 is mounted on the combination of the ground conductor 201, the dielectric member 202, the central conductors 209 and 210, and the bumps 207 in a flip-chip manner.

The central conductor 209 and the ground conductor 201 compose a microstrip transmission line in which the central conductor 209 and the ground conductor 201 are separated from each other by the dielectric member 202. The central conductor 209 extends along the longitudinal direction of the transmission line.

The central conductor 210 and the ground conductor 201 compose a microstrip transmission line in which the central conductor 210 and the ground conductor 201 are separated from each other by the dielectric member 202. The central conductor 210 extends along the longitudinal direction of the transmission line.

The transmission line including the central conductor 209 and the transmission line including the central conductor 210 are coupled with each other via the parallel arrangement of the central conductors 209 and 210.

The degree of coupling between the transmission lines depends on the distance between the overlay conductor 211 and the central conductor 209 or 210. In addition, the distance between the overlay conductor 211 and the central conductor 209 or 210 depends on the height of the bumps 207. Thus, the degree of coupling can be easily adjusted by varying the height of the bumps 207. Overlay dielectric material between the overlay conductor 211 and the central conductor 209 or 210 is air which provides a negligible dielectric loss. Therefore, the coupled line device of FIG. 24 is low in loss.

DESCRIPTION OF THE TWENTY-FOURTH PREFERRED EMBODIMENT

Figure 25:
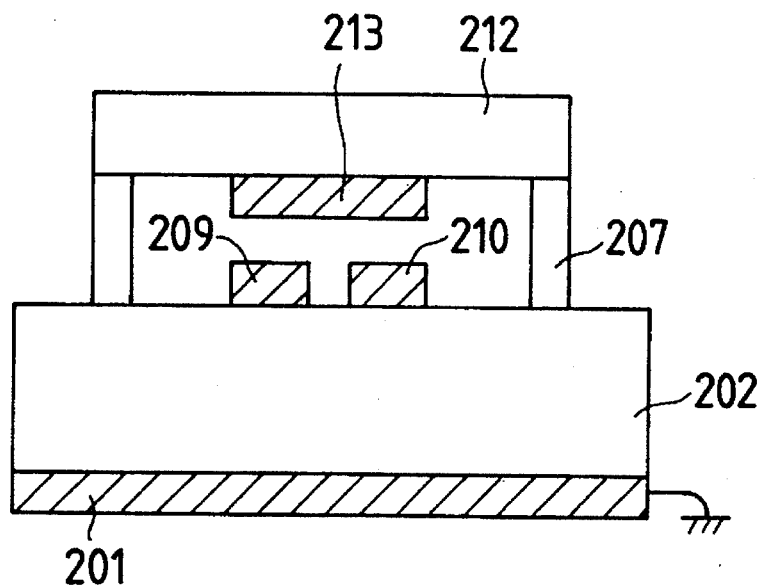
FIG. 25 is a sectional view of a coupled line device according to a twenty-fourth embodiment of this invention.

FIG. 25 shows a twenty-fourth embodiment of this invention which is similar to the embodiment of FIG. 24 except for design changes indicated hereinafter.

In the embodiment of FIG. 25, a dielectric member 212 is mounted on a dielectric member 202 via bumps 207 in a flip-flop manner. The dielectric member 212 is made of, for example, GaAs. The dielectric member 212 may include a silicon nitride film or a silicon oxide film.

An overlay conductor 213 is formed on a lower surface of the dielectric member 212. The overlay conductor 213 is located above central conductors 209 and 210. The overlay conductor 213 is spaced from the central conductors 209 and 210 by a predetermined gap. The overlay conductor 213 extends parallel with the central conductors 209 and 210. The overlay conductor 213 may be omitted.

The degree of coupling between a transmission line including the central conductor 209 and a transmission line including the central conductor 210 can be adjusted by varying the position and area of the overlay conductor 213.

DESCRIPTION OF THE TWENTY-FIFTH PREFERRED EMBODIMENT

Figure 26:
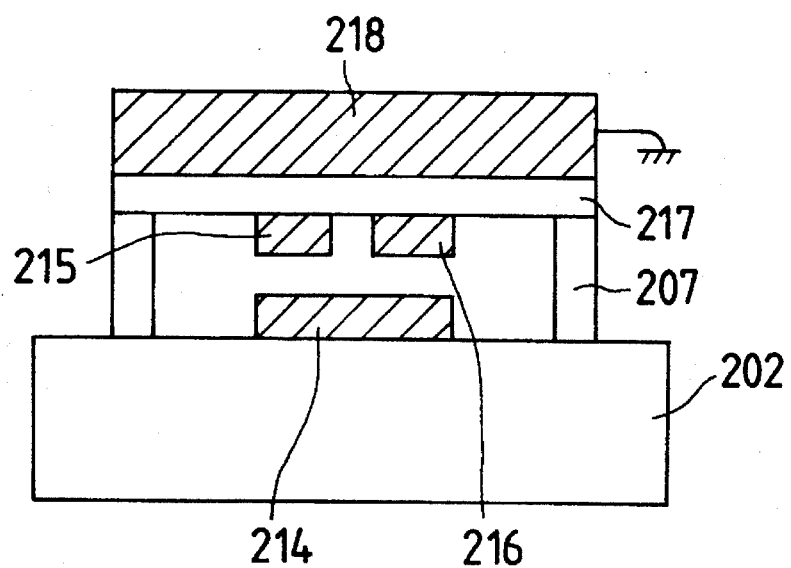
FIG. 26 is a sectional view of a coupled line device according to a twenty-fifth embodiment of this invention.

FIG. 26 shows a twenty-fifth embodiment of this invention which is similar to the embodiment of FIG. 25 except for design changes indicated hereinafter. The embodiment of FIG. 26 corresponds to an inversion of the embodiment of FIG. 25.

With reference to FIG. 26, a coupled line device includes a dielectric member 202. The dielectric member 202 is made of, for example, GaAs. The dielectric member 202 may include a silicon nitride film or a silicon oxide film. An overlay conductor 214 is formed on an upper surface of the dielectric member 202.

A ground conductor or ground plane 218 has a substrate made of electrically-conductive material such as silicon containing impurity at a high concentration. The ground conductor 218 may include a metal layer deposited on a semiconductor substrate. A dielectric film 217 is formed on a lower surface of the ground conductor 218. The dielectric film 217 is made of, for example, GaAs. The dielectric film 217 may include a silicon nitride film or a silicon oxide film. Central conductors 215 and 216 are formed on the dielectric film 217. A combination of the ground conductor 218, the dielectric film 217, and the central conductors 215 and 216 is mounted on the dielectric member 207 via bumps 207 in a flip-chip manner.

The central conductors 215 and 216 extend parallel with each other. The central conductors 215 and 216 are horizontally spaced from each other by a predetermined gap. The central conductors 215 and 216 are located between the ground conductor 218 and the overlay conductor 214. The central conductors 215 and 216 are spaced from the overlay conductor 214 by a predetermined gap.

The central conductor 215 and the ground conductor 218 compose a microstrip transmission line in which the central conductor 215 and the ground conductor 218 are separated from each other by the dielectric film 217. The central conductor 215 extends along the longitudinal direction of the transmission line.

The central conductor 216 and the ground conductor 218 compose a microstrip transmission line in which the central conductor 216 and the ground conductor 218 are separated from each other by the dielectric film 217. The central conductor 216 extends along the longitudinal direction of the transmission line.

The transmission line including the central conductor 215 and the transmission line including the central conductor 216 are coupled with each other via the parallel arrangement of the central conductors 215 and 216.

The degree of coupling between the transmission lines depends on the distance between the overlay conductor 214 and the central conductor 215 or 216. In addition, the distance between the overlay conductor 214 and the central conductor 215 or 216 depends on the height of the bumps 207. Thus, the degree of coupling can be easily adjusted by varying the height of the bumps 207. Overlay dielectric material between the overlay conductor 214 and the central conductor 215 or 216 is air which provides a negligible dielectric loss. Therefore, the coupled line device of FIG. 26 is low in loss.

DESCRIPTION OF THE TWENTY-SIXTH PREFERRED EMBODIMENT

Figure 27:
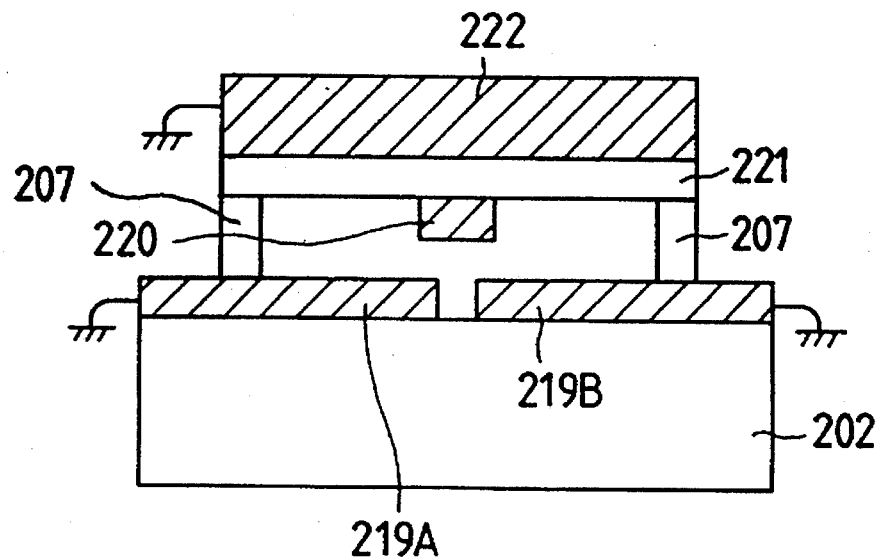
FIG. 27 is a sectional view of a conversion device according to a twenty-sixth embodiment of this invention.

FIG. 27 shows a twenty-sixth embodiment of this invention which relates to a device for conversion or coupling between a microstrip line and a slot line.

The device of FIG. 27 includes a dielectric member 202 on which ground conductors 219A and 219B are formed. The ground conductors 219A and 219B are spaced from each other by a slot of a predetermined width. The ground conductors 219A and 219B may be a single conductor having a slot.

A dielectric film 221 is formed on a ground conductor 222. A central conductor 220 is formed on the dielectric film 221. A combination of the ground conductor 222, the dielectric film 221, and the central conductor 220 is mounted on a combination of the dielectric member 202 and the ground conductors 219A and 219B via bumps 207 in a flip-chip manner.

The dielectric-film 221 is separated from the ground conductors 219A and 219B by a predetermined gap corresponding to the height of the bumps 207. The central conductor 220 is located between the ground conductor 222 and a set of the ground conductors 219A and 219B. The central conductor 220 is spaced from the ground conductors 219A and 219B by a predetermined gap. The central conductor 220 is located above the slot between the ground conductors 219A and 219B.

The device of FIG. 27 is fabricated as follows. The ground conductors 219A and 219B are formed on the dielectric member 202. In addition, the bumps 207 are provided on the dielectric member 202 in a way such as to not affect the slot between the ground conductors 219A and 219B. In this way, a combination of the dielectric constant 202, the ground conductors 219A and 219B, and the bumps 207 is made. On the other hand, the dielectric film 221 is formed on the ground conductor 222. The central conductor 220 is formed on the dielectric film 221. In this way, a combination of the ground conductor 222, the dielectric film 221, and the central conductor 220 is made. The combination of the ground conductor 222, the dielectric film 221, and the central conductor 220 is mounted on the combination of the dielectric constant 202, the ground conductors 219A and 219B, and the bumps 207 in a flip-chip manner.

The central conductor 220 and the ground conductor 222 compose a microstrip transmission line in which the central conductor 220 and the ground conductor 222 are separated from each other by the dielectric film 221. The slot or gap between the ground conductors 219A and 219B provides a slot line coupled with the microstrip line.

The degree of coupling between the microstrip line and the slot line can be adjusted by varying the height of the bumps 207 or the angular relation between the central conductor 220 and the slot between the ground conductors 219A and 219B.

DESCRIPTION OF THE TWENTY-SEVENTH PREFERRED EMBODIMENT

Figure 28:
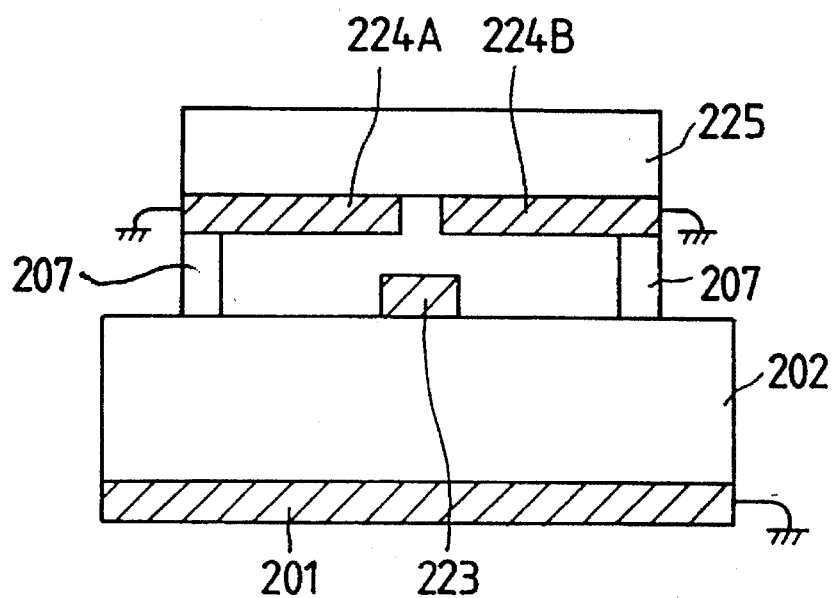
FIG. 28 is a sectional view of a conversion device according to a twenty-seventh embodiment of this invention.

FIG. 28 shows a twenty-seventh embodiment of this invention which is similar to the embodiment of FIG. 27 except for design changes indicated hereinafter. The embodiment of FIG. 28 corresponds to an inversion of the embodiment of FIG. 27. The embodiment of FIG. 28 relates to a device for conversion or coupling between a microstrip line and a slot line.

The device of FIG. 28 includes a dielectric member 202. A ground conductor 201 is formed on a lower surface of the dielectric member 202. A central conductor 223 is formed on an upper surface of the dielectric member 202.

Ground conductors 224A and 224B are formed on a lower surface of a dielectric member 225. The ground conductors 224A and 224B are spaced from each other by a slot of a predetermined width. The ground conductors 224A and 224B may be a single conductor having a slot. A combination of the dielectric member 225 and the ground conductors 224A and 224B is mounted on the dielectric member 202 via bumps 207 in a flip-chip manner.

The ground conductors 224A and 224B are separated from the dielectric member 202 by a predetermined gap corresponding to the height of the bumps 207. The central conductor 223 is located between the ground conductor 201 and a set of the ground conductors 224A and 224B. The central conductor 223 is spaced from the ground conductors 224A and 224B by a predetermined gap. The central conductor 223 is located below the slot between the ground conductors 224A and 224B.

The device of FIG. 28 is fabricated as follows. After a combination of the dielectric member 202 and the ground conductor 201 is made, the central conductor 223 is formed on the dielectric member 202. In addition, the bumps 207 are provided on the dielectric member 202. The bumps 207 are horizontally spaced from the central conductor 223 by a predetermined distance which is chosen so that the bumps 207 and the central conductor 223 can be prevented from interfering with each other. In this way, a combination of the dielectric member 202, the ground conductor 201, the central conductor 223, and the bumps 207 is made. On the other hand, the ground conductors 224A and 224B are formed on the dielectric member 225. In this way, a combination of the dielectric member 225 and the ground conductors 224A and 224B is made. The combination of the dielectric member 225 and the ground conductors 224A and 224B is mounted on the combination of the dielectric member 202, the ground conductor 2010 the central conductor 223, and the bumps 207 in a flip-chip manner.

The central conductor 223 and the ground conductor 201 compose a microstrip transmission line in which the central conductor 223 and the ground conductor 201 are separated from each other by the dielectric member 202. The slot or gap between the ground conductors 224A and 224B provides a slot line coupled with the microstrip line.

The degree of coupling between the microstrip line and the slot line can be adjusted by varying the height of the bumps 207 or the angular relation between the central conductor 223 and the slot between the ground conductors 224A and 224B.

What is claimed is:

1. A semiconductor device comprising:

a microstrip wiring board including a substrate having a main surface, a metal wiring line extending on the main surface of the substrate, a dielectric film extending on the metal wiring line, and a ground conductor extending on the dielectric film, the metal wiring line being fixed to the main surface of the substrate without using adhesive, the dielectric film being fixed to the metal wiring line without using adhesive, the ground conductor being fixed to the dielectric film without using adhesive, the substrate comprising one of silicon and glass, wherein the metal wiring line, the dielectric film, and the ground conductor comprise a microstrip transmission line;

a bumps and a semiconductor chip connected to the microstrip wiring board via the bump.

* * * * *